(12) United States Patent
Yun et al.

(10) Patent No.: US 12,046,702 B2
(45) Date of Patent: Jul. 23, 2024

(54) LIGHT EMITTING ELEMENT INK, DISPLAY DEVICE, AND METHOD OF MANUFACTURING THE SAME

(71) Applicant: Samsung Display Co., LTD., Yongin-si (KR)

(72) Inventors: Sung Jae Yun, Hwaseong-si (KR); Yuk Hyun Nam, Cheonan-si (KR); Sang Hoon Park, Seongnam-si (KR); Hang Jae Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 380 days.

(21) Appl. No.: 17/452,762

(22) Filed: Oct. 28, 2021

(65) Prior Publication Data

US 2022/0140195 A1 May 5, 2022

(30) Foreign Application Priority Data

Nov. 2, 2020 (KR) ........................ 10-2020-0144403

(51) Int. Cl.
*H01L 33/38* (2010.01)
*H01L 27/15* (2006.01)
*H01L 33/00* (2010.01)
*H01L 33/44* (2010.01)

(52) U.S. Cl.
CPC .......... *H01L 33/382* (2013.01); *H01L 27/156* (2013.01); *H01L 33/0095* (2013.01); *H01L 33/44* (2013.01)

(58) Field of Classification Search
None
See application file for complete search history.

(56) References Cited

U.S. PATENT DOCUMENTS

| | | | |
|---|---|---|---|
| 2010/0224881 A1* | 9/2010 | Park ....................... | H10K 50/80 257/E33.003 |
| 2011/0175122 A1* | 7/2011 | Kim ........................ | H01L 33/62 257/E33.001 |
| 2011/0198653 A1* | 8/2011 | Cho ....................... | H01L 33/486 257/E33.072 |
| 2014/0110737 A1* | 4/2014 | Matsumura ............. | H01L 33/60 257/98 |
| 2014/0239341 A1* | 8/2014 | Matsumura ........... | H01L 33/382 257/99 |
| 2019/0013443 A1* | 1/2019 | Nakabayashi .......... | H01L 33/60 |
| 2019/0347979 A1* | 11/2019 | Ahmed ................ | G02B 3/0056 |

FOREIGN PATENT DOCUMENTS

KR 10-1429095 B1 8/2014

* cited by examiner

*Primary Examiner* — Evren Seven
(74) *Attorney, Agent, or Firm* — Lewis Roca Rothgerber Christie LLP

(57) ABSTRACT

A light emitting element ink, a display device, and a method of manufacturing the same are provided. The light emitting element ink includes a solvent, a light emitting element dispersed in the solvent, the light emitting element including a plurality of semiconductor layers and an insulating film partially surrounding outer surfaces of the plurality of semiconductor layers, and a reactive mesogen dispersed in the solvent.

12 Claims, 21 Drawing Sheets

LIGHT EMITTING ELEMENT INK, DISPLAY DEVICE, AND METHOD OF MANUFACTURING THE SAME

CROSS-REFERENCE TO RELATED APPLICATION

This application claims priority to and the benefit of Korean Patent Application No. 10-2020-0144403, filed on Nov. 2, 2020, in the Korean Intellectual Property Office, the entire content of which is incorporated herein by reference.

BACKGROUND

1. Field

Embodiments of the present disclosure relate to a light emitting element ink, a display device, and a method of manufacturing the same.

2. Description of the Related Art

Display devices are becoming increasingly important with the development of multimedia. Accordingly, various types or kinds of display devices such as organic light emitting displays and liquid crystal displays are being used.

A display device is a device for displaying an image and includes a display panel such as an organic light emitting display panel or a liquid crystal display panel. As a light emitting display panel, the display panel may include light emitting elements such as light emitting diodes (LEDs). For example, the LEDs may be organic light emitting diodes (OLEDs) that include an organic material as a fluorescent material or may be inorganic LEDs that include an inorganic material as the fluorescent material.

SUMMARY

An aspect of an embodiment of the present disclosure provides a light emitting element ink capable of preventing the detachment (or capable of reducing a likelihood or occurrence of the detachment) of aligned light emitting elements.

Another aspect of an embodiment of the present disclosure provides a display device capable of simplifying a process using the light emitting element ink and a method of manufacturing the same.

According to an embodiment of the disclosure, the light emitting element ink includes a solvent, a light emitting element dispersed in the solvent, the light emitting element including a plurality of semiconductor layers and an insulating film partially surrounding outer surfaces of the plurality of semiconductor layers, and a reactive mesogen dispersed in the solvent.

In an embodiment, the reactive mesogen includes at least one selected from a diacrylate-based monomer, an acrylate-based monomer, and an epoxy-based monomer.

In an embodiment, the reactive mesogen is included in an amount of 0.1 parts by weight to 1 part by weight based on 100 parts by weight of the light emitting element ink.

In an embodiment, the light emitting element is included in an amount of 0.01 parts by weight to 1 part by weight based on 100 parts by weight of the light emitting element ink.

According to an embodiment of the disclosure, the display device includes a substrate, a first electrode and a second electrode each extending on the substrate in one direction and spaced apart from each other, a first insulating layer on the substrate and covering the first electrode and the second electrode, a light emitting element on the first insulating layer and having two ends on the first electrode and the second electrode, respectively, and a plurality of protrusions arranged on the first insulating layer and the light emitting element.

In an embodiment, the plurality of protrusions include a polymer produced by polymerization of the reactive mesogen.

In an embodiment, the plurality of protrusions are randomly arranged to be spaced apart from each other and expose at least a portion of the surface of the first insulating layer.

In an embodiment, at least one of the plurality of protrusions may overlap the light emitting element and the first insulating layer.

In an embodiment, at least one of the plurality of protrusions is in contact with the first insulating layer and the light emitting element.

In an embodiment, the light emitting element includes a first semiconductor layer, a light emitting layer, a second semiconductor layer, and an electrode layer, which are stacked in one direction, and the light emitting element further includes an insulating film partially surrounding outer surfaces of the first semiconductor layer, the light emitting layer, the second semiconductor layer, and the electrode layer.

In an embodiment, the display device further includes a first contact electrode on the first electrode and contacting one end of the light emitting element, and a second contact electrode on the second electrode and contacting the other end of the light emitting element.

In an embodiment, at least one of the plurality of protrusions is between the first contact electrode and the light emitting element, and is in contact with the first contact electrode, the light emitting element, and the first insulating layer.

In an embodiment, at least one of the plurality of protrusions is in contact with the first contact electrode, the first insulating layer, and the electrode layer at one end of the light emitting element.

In an embodiment, at least one of the plurality of protrusions is between the second contact electrode and the light emitting element, and is in contact with the second contact electrode, the light emitting element, and the first insulating layer.

In an embodiment, at least one of the plurality of protrusions is in contact with the second contact electrode, the first insulating layer, and the first semiconductor layer at the other end of the light emitting element.

In an embodiment, the display device further includes a bank that partitions a light emission area in which the light emitting element is on the first insulating layer, and the plurality of protrusions are arranged in the light emission area.

According to an embodiment of the disclosure, a method of manufacturing a display device includes: preparing a light emitting element ink in which light emitting elements and reactive mesogens are dispersed in a solvent, and a target substrate in which a first insulating layer is on a first electrode and a second electrode, primarily spraying the light emitting element ink on the target substrate, generating an electric field on the target substrate to primarily align the light emitting elements on the first electrode and the second electrode, primarily irradiating the target substrate with UV to form a plurality of protrusions, and primarily heat-treating the target substrate.

In an embodiment, the method further includes, after primarily heat-treating the target substrate, secondarily spraying the light emitting element ink on the target substrate, generating an electric field on the target substrate to secondarily align the light emitting elements on the first electrode and the second electrode, secondarily irradiating the target substrate with ultraviolet light (UV) to further form a plurality of protrusions, and secondarily heat-treating the target substrate.

In an embodiment, the plurality of protrusions are formed through polymerization of the reactive mesogens by the primary UV irradiation and the secondary UV irradiation.

In an embodiment, the solvent is removed by the primary heat treatment and the secondary heat treatment.

However, aspects of embodiments of the present disclosure are not restricted to the ones set forth herein. The above and other aspects of embodiments of the present disclosure will become more apparent to one of ordinary skill in the art to which the present disclosure pertains by referencing the detailed description of the present disclosure given below.

BRIEF DESCRIPTION OF THE DRAWINGS

The above and other aspects and features of embodiments of the present disclosure will become more apparent by describing in more detail embodiments thereof with reference to the attached drawings, in which.

DETAILED DESCRIPTION

The subject matter of the present disclosure will now be described more fully hereinafter with reference to the accompanying drawings, in which example embodiments of the disclosure are shown. The subject matter of this disclosure may, however, be embodied in different forms and should not be construed as being limited to the embodiments set forth herein. Rather, these embodiments are provided so that this disclosure will be thorough and complete, and will fully convey the scope of the disclosure to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the spirit and scope of the present disclosure. Similarly, the second element could also be termed the first element.

Each of the features of the various embodiments of the present disclosure may be combined with each other, in part or in whole, and technically various interlocking and driving are possible. Each embodiment may be implemented independently of each other or may be implemented together in an association.

Hereinafter, embodiments of the present disclosure will be described with reference to the attached drawings.

Figure 1:
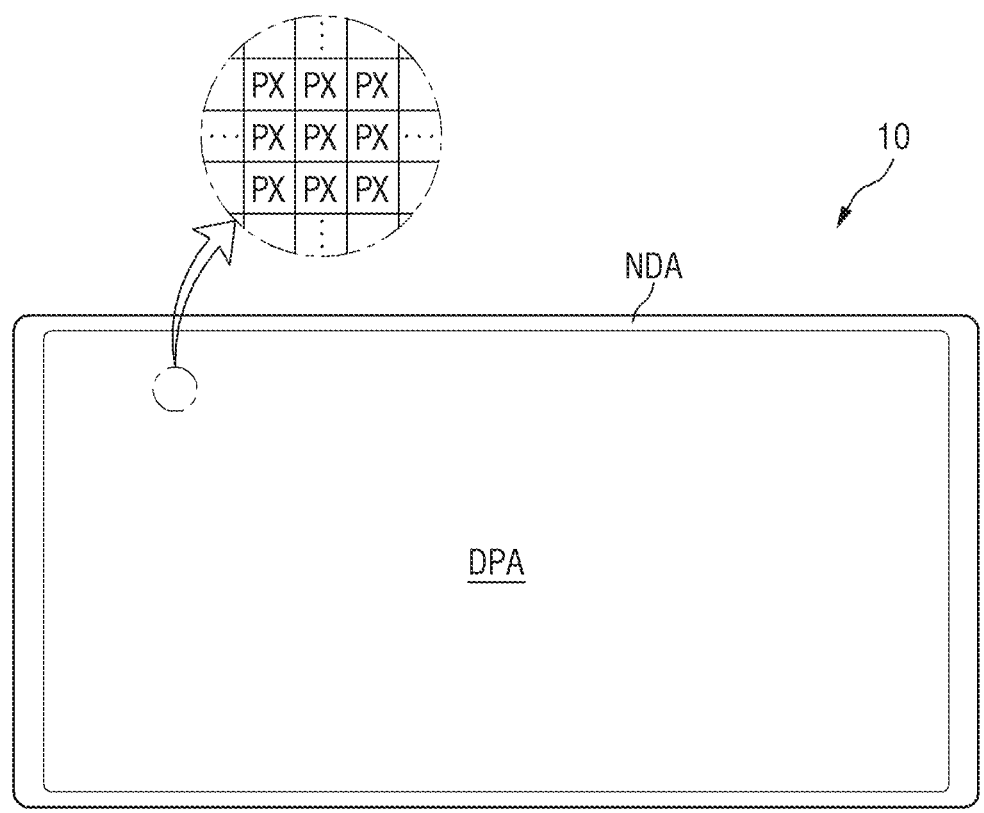
FIG. 1 is a schematic plan view of a display device according to an embodiment.

FIG. 1 is a schematic plan view of a display device according to an embodiment.

Referring to FIG. 1, a display device 10 displays a mobile image (e.g., a moving image or video) or a still image. The display device 1 may refer to any suitable electronic device that provides a display screen. For example, the display device 10 may be used in televisions, notebooks, monitors, billboards, internet of things, mobile phones, smart phones, tablet personal computers (PCs), electronic watches, smart watches, watch phones, head mounted displays, mobile communication terminals, electronic notebooks, electronic books, portable multimedia players (PMPs), navigators, game machines, digital cameras, camcorders, and/or the like.

The display device 10 includes a display panel for providing a display screen. Examples of the display panel may include an inorganic light emitting diode display panel, an organic light emitting display panel, a quantum dot light emitting display panel, a plasma display panel, and a field emission display panel. Hereinafter, there will be described example embodiments where an inorganic light emitting diode display panel is used as the display panel, but the present disclosure is not limited thereto. Any suitable display panel may be used as the display panel as long as the same (e.g., substantially the same) technical idea is applicable.

The shape of the display device 10 may be variously modified. For example, the display device 10 may have a shape such as a rectangle having longer horizontal sides, a rectangle having longer vertical sides, a square, a rectangle having round corners (vertexes), another polygon, or a circle (or variations thereof such as, for example, an oval). The shape of a display area DPA of the display device 10 may also be similar to the overall shape of the display device 10. FIG. 1 illustrates a display device 10 and a display area DPA each having a rectangular shape having longer horizontal sides.

The display device 1 may include a display area DPA and a non-display area NDA. The display area DPA is an area where an image is displayed, and the non-display area NDA is an area where an image is not displayed (or an area that is not designed to display an image). The display area DPA may be referred to as an active area, and the non-display area NDA may be referred to as an inactive area. The display area DPA may generally occupy the center of the display device 1.

The display area DPA may include a plurality of pixels PX. The plurality of pixels PX may be arranged in a matrix direction. Each of the pixels PX may have a rectangular shape or a square shape in a plan view, but the shape thereof is not limited thereto. Each of the pixels PX may have a rhombus shape in which each side is inclined with respect to one direction. The respective pixels PX may be alternately arranged in a stripe type (or kind) or a PENTILE® arrangement structure (e.g., an RGBG matrix, RGBG structure, or RGBG matrix structure). PENTILE® is a duly registered trademark of Samsung Display Co., Ltd. Each of the pixels PX includes at least one light emitting element 30 emitting light of a set or specific wavelength band to display a set or specific color.

The non-display area NDA may be around the display area DPA. The non-display area NDA may entirely or partially surround the display area DPA. The display area DPA may have a rectangular shape, and the non-display area NDA may be adjacent to four sides of the display area DPA. The non-display area NDA may constitute a bezel of the display device 10. Wirings or circuit drivers included in the display device 10 may be in the non-display area NDA, or external devices may be mounted in the non-display area NDA.

Figure 2:
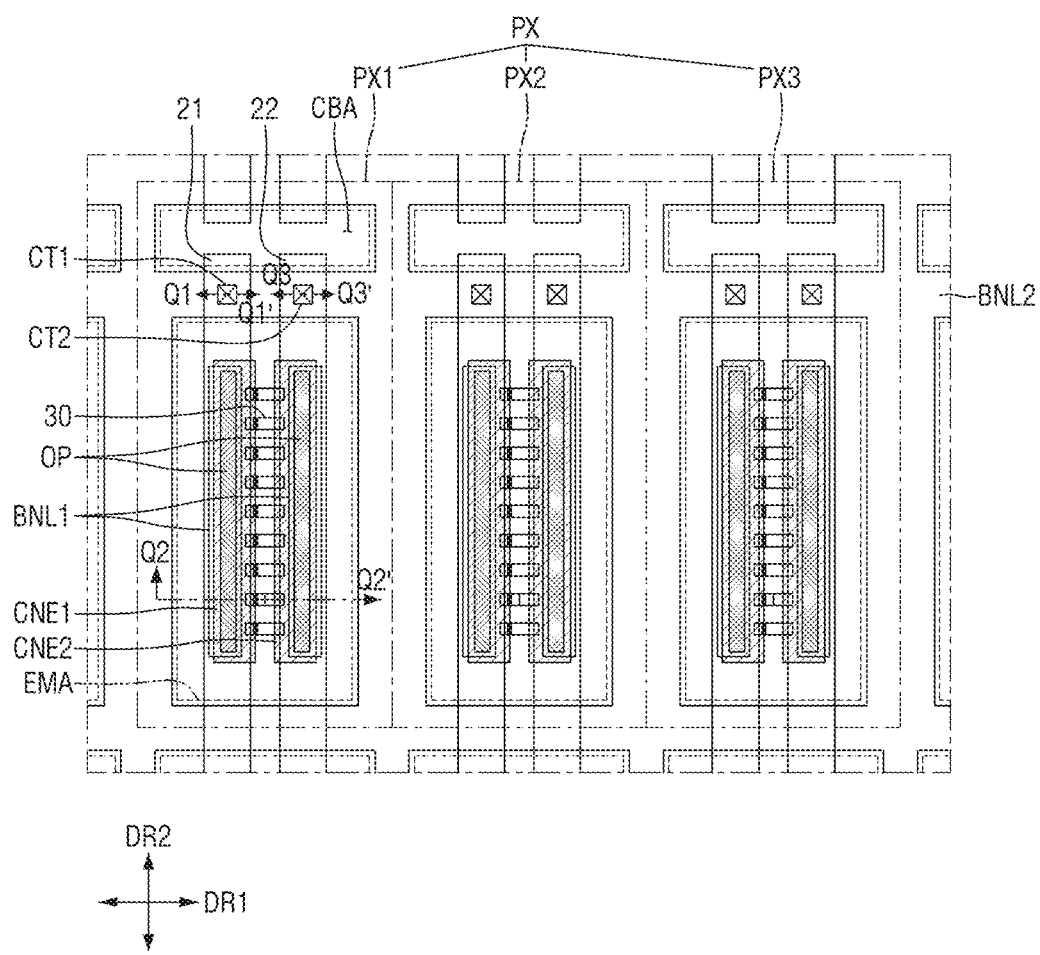
FIG. 2 is a plan view illustrating one pixel of a display device according to an embodiment.

FIG. 2 is a plan view illustrating one pixel of a display device according to an embodiment.

Referring to FIG. 2, each of the pixels PX may include a plurality of sub-pixels PXn (n is an integer of 1 to 3). For example, one pixel PX may include a first sub-pixel PX1, a second sub-pixel PX2, and a third sub-pixel PX3. The first sub-pixel PX1 may emit light of a first color, the second sub-pixel PX2 may emit light of a second color, and the third sub-pixel PX3 may emit light of a third color. For example, the first color may be blue, the second color may be green, and the third color may be red. However, the present disclosure is not limited thereto, and each of the sub-pixels PXn may emit light of the same color. Although it is shown in FIG. 2 that the pixel PX includes three sub-pixels PXn, the present disclosure is not limited thereto, and the pixel PX may include a larger number of sub-pixels PXn.

Each of the sub-pixels PXn of the display device 10 may include a light emission area EMA and a non-light emission area. The light emission area EMA is defined as an area in which a light emitting element 30 emits light of a set or specific wavelength band, and the non-light emission area is defined as an area in which no light emitting element 30 is located and no light is emitted (or is not designed to emit light). The light emission area EMA may include an area in which the light emitting element 30 is located, and an area adjacent to the light emitting element 30 to discharge light emitted from the light emitting element 30.

However, the present disclosure is not limited thereto, and the light emission area may also include an area in which light emitted from the light emitting element 30 is reflected or refracted by another member and then emitted. The plurality of light emitting elements 30 may be arranged in each of the sub-pixels PXn, and the light emission area may be formed by an area in which the plurality of light emitting elements 30 are arranged and an area adjacent to this area.

Each of the sub-pixels PXn may include a cut area CBA in the non-light emission area. The cut area CBA may be at one side of the light emission area EMA in the second direction DR2. The cut area CBA may be between the light emission areas EMA of the adjacent sub-pixels PXn in the second direction DR2. A plurality of light emission areas EMA and a plurality of cut areas CBA may be arranged in the display area DPA of the display device 10. For example, the plurality of light emission areas EMA and the plurality of cut area CBA are repeatedly arranged in the first direction DR1, respectively, and may be alternately arranged in the second direction DR2. The distance between the cut areas CBA spaced apart from each other in the first direction DR1 may be smaller than the distance between the light emission areas EMA spaced apart from each other in the first direction DR1. A second bank BNL2 may be between the cut areas CBA and the light emission areas EMA, and the distance therebetween may be changed depending on the width of the second bank BNL2. Because the light emitting element 30 is not in the cut area CBA, light is not emitted, but a portion of each of electrodes 21 and 22 in each of the sub-pixels PXn may be in the cut area CBA. The electrodes 21 and 22 for each of the sub-pixels PXn may be located separately from each other (e.g., may be spaced apart from each other) in the cut area CBA.

Figure 3:
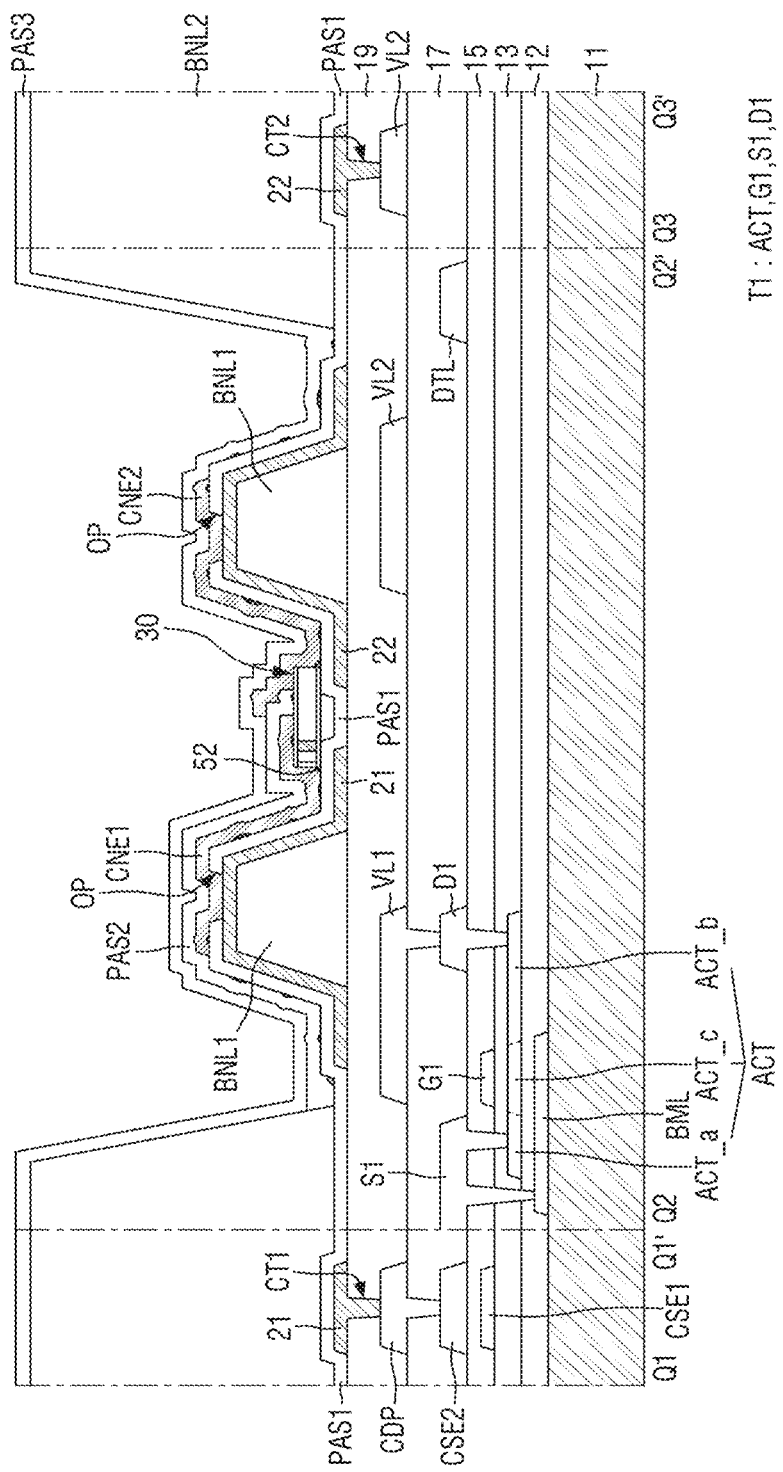
FIG. 3 is a cross-sectional view taken along the lines Q1-Q1', Q2-Q2', and Q3-Q3' of FIG. 2.

FIG. 3 is a cross-sectional view taken along the lines Q1-Q1', Q2-Q2', and Q3-Q3' of FIG. 2. FIG. 3 is a cross-sectional view of both ends of the light emitting element 30 in the first sub-pixel PX1 of FIG. 2.

Referring to FIG. 3 together with FIG. 2, the display device 10 may include a substrate 11, and a semiconductor layer, a plurality of conductive layers, and a plurality of insulating layers, which are on the substrate 11. The semiconductor layer, the conductive layers, and the insulating layers may constitute a circuit layer and a light emitting element layer of the display device 10, respectively.

In one or more embodiments, the substrate 11 may be an insulating substrate. The substrate 11 may be made of an insulating material such as glass, quartz, and/or polymer resin. The substrate 11 may be a rigid substrate, but may also be a flexible substrate capable of bending, folding, rolling, and/or the like.

A light blocking layer BML may be on the substrate 11. The light blocking layer BML may overlap an active layer ACT of a first transistor T1 of the display device 10. The light blocking layer BML may include a material blocking light, thereby preventing or reducing entrance of light to the active layer ACT of the first transistor. For example, the light blocking layer BML may be formed of an opaque metal material that blocks or reduces light transmission. However, the present disclosure is not limited thereto, and in some cases, the light blocking layer BML may be omitted.

A buffer layer 12 may be entirely on the substrate 11 and the light blocking layer BML. The buffer layer 12 may be on the substrate 11 to protect the first transistors T1 of the pixel PX from moisture penetrating through the substrate 11 which is vulnerable to moisture permeation, and may perform a surface planarization function. The buffer layer 12 may be formed as a plurality of inorganic layers alternately stacked. For example, the buffer layer 12 may be formed to have a multi-layer structure in which inorganic layers including at least one selected from silicon oxide (SiOx), silicon nitride (SiNx), and silicon oxynitride (SiOxNy) are alternately stacked.

A semiconductor layer is on the buffer layer 12. The semiconductor layer may include the active layer ACT of the first transistor T1. The semiconductor layer and the buffer layer 12 may partially overlap a gate electrode G1 and/or the like of a first gate conductive layer to be described further herein below.

Although only the first transistor T1 among the transistors included in the sub-pixel PXn is shown in the drawings, the present disclosure is not limited thereto. The display device 10 may include a larger number of transistors. For example, the display device 10 may further include one or more transistors in addition to the first transistor T1 for each sub-pixel PXn to include two or three transistors.

The semiconductor layer may include polycrystalline silicon, monocrystalline silicon, and/or oxide semiconductor. When the semiconductor layer includes an oxide semiconductor, each active layer ACT may include a plurality of conducting regions ACT_a and ACT_b and a channel region ACT_c therebetween. The oxide semiconductor may be an oxide semiconductor containing indium (In). For example, the oxide semiconductor may be indium-tin oxide (ITO), indium-zinc oxide (IZO), indium-gallium oxide (IGO), indium-zinc-tin oxide (IZTO), indium-gallium-tin oxide (IGTO), indium-gallium-zinc oxide (IGZO), and/or indium-gallium-zinc-tin oxide (IGZTO).

In another embodiment, the semiconductor layer may include polycrystalline silicon. Polycrystalline silicon may be formed by crystallizing amorphous silicon, and in this case, the conducting regions of the active layer ACT may be doped regions doped with impurities, respectively.

A first gate insulating layer 13 is on the semiconductor layer and the buffer layer 12. The first gate insulating layer 13 may be on the buffer layer 12 in addition to the semiconductor layer. The first gate insulating layer 13 may function as a gate insulating layer of each transistor. The first gate insulating layer 13 may be formed of an inorganic layer including an inorganic material, such as silicon oxide (SiOx), silicon nitride (SiNx), and/or silicon oxynitride (SiOxNy), or may be formed as a stacked structure of the inorganic layers.

A first gate conductive layer is on the first gate insulating layer 13. The first gate conductive layer may include a gate electrode G1 of the first transistor T1 and a first capacitance electrode CSE1 of a storage capacitor. The gate electrode G1 may overlap the channel region of the active layer ACT in the thickness direction. The first capacitance electrode CSE1 may overlap a second capacitance electrode CSE2 to be described further herein below in the thickness direction. In an embodiment, the first capacitance electrode CSE1 may be coupled and integrated with the gate electrode G1. The first capacitance electrode CSE1 may overlap the second capacitance electrode CSE2 in the thickness direction, and the storage capacitor may be formed between the first capacitance electrode CSE1 and the second capacitance electrode CSE2.

The first gate conductive layer may be formed as a single layer or as multiple layers including any one selected from molybdenum (Mo), aluminum (Al), chromium (Cr), gold (Au), titanium (Ti), nickel (Ni), neodymium (Nd), copper (Cu), and an alloy thereof. However, the present disclosure is not limited thereto.

A first interlayer insulating layer 15 is on the first gate conductive layer. The first interlayer insulating layer 15 may function as an insulating layer between the first gate conductive layer and other layers thereon. The first interlayer insulating layer 15 may cover the first gate conductive layer to perform a function of protecting the first gate conductive layer. The first interlayer insulating layer 15 may be formed of an inorganic layer including an inorganic material, such as silicon oxide (SiOx), silicon nitride (SiNx), and/or silicon oxynitride (SiOxNy), or may be formed as a stacked structure of the inorganic layers.

A first data conductive layer is on the first interlayer insulating layer 15. The first data conductive layer may include a first source electrode S1 and first drain electrode D1 of the first transistor T1, a data line DTL, and a second capacitance electrode CSE2.

The first source electrode S1 and first drain electrode D1 of the first transistor T1 may contact (e.g., physically contact) the doped regions ACT_a and ACT_b of the active layer ACT through a contact hole penetrating the first interlayer insulating layer 15 and the first gate insulating layer 13, respectively. Further, the first source electrode S1 of the first transistor T1 may be electrically coupled to the light blocking layer BML through another contact hole.

The data line DTL may apply a data signal to another transistor included in the display device 10. In one or more embodiments, the data line DTL may be to a source/drain electrode of another transistor to transmit a signal applied from the data line DTL.

The second capacitance electrode CSE2 may overlap the first capacitance electrode CSE1 in the thickness direction. In an embodiment, the second capacitance electrode CSE2 may be integrated and coupled with the first source electrode S1.

The first data conductive layer may be formed as a single layer or as multiple layers including any one selected from molybdenum (Mo), aluminum (Al), chromium (Cr), gold (Au), titanium (Ti), nickel (Ni), neodymium (Nd), copper (Cu), and an alloy thereof. However, the present disclosure is not limited thereto.

A second interlayer insulating layer 17 is on the first data conductive layer. The second interlayer insulating layer 17 may function as an insulating layer between the first data conductive layer and other layers thereon. The second interlayer insulating layer 17 may cover the first data conductive layer to perform a function of protecting the first data conductive layer. The second interlayer insulating layer 17 may be formed of an inorganic layer including an inorganic material, such as silicon oxide (SiOx), silicon nitride (SiNx), and/or silicon oxynitride (SiOxNy), or may be formed as a stacked structure of the inorganic layers.

A second data conductive layer is on the second interlayer insulating layer 17. The second data conductive layer may include a first voltage line VL1, a second voltage line VL2, and a first conductive pattern CDP. A high-potential voltage (or a first power voltage) supplied to the first transistor T1 may be applied to first voltage line VL1, and a low-potential voltage (or a second power voltage) supplied to the second electrode 22 may be applied to the second voltage line VL2. During the process of manufacturing the display device 10, an alignment signal necessary to align the light emitting elements 30 may be applied to the second voltage line VL2.

The first conductive pattern CDP may be coupled to the second capacitance electrode CSE2 through a contact hole formed in the second interlayer insulating layer 17. The second capacitive electrode CSE2 may be integrated with the first source electrode S1 of the first transistor T1, and the first conductive pattern CDP may be electrically coupled to the first source electrode S1. The first conductive pattern CDP may be in contact (e.g., physical contact) with the first electrode 21, which will be described further herein below. The first transistor T1 may transfer a first power voltage applied from the first voltage line VL1 to the first electrode 21 through the first conductive pattern CDP. Although it is shown in the drawings that the second data conductive layer includes one second voltage line VL2 and one first voltage line VL1, the present disclosure is not limited thereto. The second data conductive layer may include a larger number of first voltage lines VL1 and a larger number of second voltage lines VL2.

The second data conductive layer may be formed as a single layer or as multiple layers including any one selected from molybdenum (Mo), aluminum (Al), chromium (Cr), gold (Au), titanium (Ti), nickel (Ni), neodymium (Nd), copper (Cu), and an alloy thereof. However, the present disclosure is not limited thereto.

A first planarization layer 19 is on the second data conductive layer. The first planarization layer 19 may include an organic insulating material, for example, an organic material such as polyimide (PI), and may perform a surface planarization function.

A plurality of first banks BNL1, a plurality of electrodes 21 and 22, a light emitting element 30, and a plurality of contact electrodes CNE1 and CNE2, and a plurality of second banks BNL2 may be arranged on the first planarization layer 19. Further, a plurality of insulating layers PAS1 and PAS2 may be arranged on the first planarization layer 19.

The plurality of first banks BNL1 may be directly on the first planarization layer 19. The plurality of first banks BNL1 have a shape extending in the second direction DR2 within each sub-pixel PXn, but may not extend to another sub-pixel PXn neighboring in the second direction DR2 and may be in the light emission area EMA. Further, the plurality of first banks BNL1 may be spaced apart from each other in the first direction DR1, and the light emitting element 30 may be therebetween. The plurality of first banks BNL1 may be located for each sub-pixel PXn to form a linear pattern in the display area DPA of the display device 10. Although two first banks BNL1 are shown in the drawing, the present disclosure is not limited thereto. A larger number of first banks BNL1 may be included depending on the number of electrodes 21 and 22.

The first bank BNL1 may have a structure in which at least a part thereof protrudes from the upper surface of the first planarization layer 19. The protrusion portion of the first bank BNL1 may have an inclined side surface, and the light emitted from the light emitting element 30 may be reflected from the electrodes 21 and 22 on the first bank BNL1 and emitted in the upward direction of the planarization layer 19. The first bank BNL1 may provide an area in which the light emitting element 30 is located, and at the same time, may function as a reflective barrier that reflects light emitted from the light emitting element 30 in an upward direction. The side surface of the first bank BNL1 may be inclined in a linear shape, but is not limited thereto, and the first bank BNL1 may have a curved semi-circle or semi-ellipse shape. The first bank BNL1 may include an organic insulating material such as polyimide (PI), but the material thereof is not limited thereto.

The plurality of electrodes 21 and 22 may be on the first bank BNL1 and the first planarization layer 19. The plurality of electrodes 21 and 22 may include a first electrode 21 and a second electrode 22. The first electrode 21 and the second electrode 22 may extend in the second direction DR2, and may be spaced apart from each other in the first direction DR1.

Each of the first electrode 21 and the second electrode 22 may extend in the second direction DR2 within the sub-pixel PXn, and may be separated from other electrodes 21 and 22 in the cut area CBA. For example, the cut area CBA may be between the light emission areas EMA of the sub-pixels PXn neighboring in the second direction DR2, and the first electrode 21 and the second electrode 22 may be separated from other first and second electrodes 21 and 22 in the sub-pixels PXn neighboring in the second direction DR2 in the cut area CBA. However, the present disclosure is not limited thereto, and some of the electrodes 21 and 22 may extend beyond the sub-pixels PXn neighboring in the second direction DR2 without being separated from each other for each pixel PXn, or only one of the first electrode 21 and the second electrode 22 may be separated.

The first electrode 21 may be electrically coupled to the first transistor T1 through a first contact hole CT1, and the second electrode 22 may be electrically coupled to the second voltage line VL2 through a second contact hole CT2. For example, the first electrode 21 may contact (e.g., physically contact) the first conductive pattern CDP through the first contact hole CT1 penetrating the first planarization layer 19 in the portion extending in the first direction DR1 of the second bank BNL2. The second electrode 22 may also contact (e.g., physically contact) the second voltage line VL2 through the second contact hole CT2 penetrating the first planarization layer 19 In the portion extending in the first direction DR1 of the second bank BNL2. However, the present disclosure is not limited thereto. In another embodiment, the first contact hole CT1 and the second contact hole CT2 may be in the light emission area EMA surrounded by the second bank BNL2 so as not to overlap the second bank BNL2.

Although it is illustrated in the drawings that one first electrode 21 and one second electrode 22 are included for each sub-pixel PXn, the present disclosure is not limited thereto, and the number of first electrodes 21 and second electrodes 22 included for each sub-pixel PXn may be greater. The first electrode 21 and the second electrode 22 in each sub-pixel PXn may not necessarily have a shape extending in one direction, and the first electrode 21 and the second electrode 22 may be in various suitable structures. For example, the first electrode 21 and the second electrode 22 may have a partially curved and/or bent shape, and one electrode may be arranged to surround the other electrode.

Each of the first electrode 21 and the second electrode 22 may be directly on the first banks BNL1. Each of the first electrode 21 and the second electrode 22 may be formed to have a larger width than the first bank BNL1. For example, each of the first electrode 21 and the second electrode 22 may completely cover the outer surface of the first bank BNL1. The first electrode 21 and the second electrode 22 are respectively on the side surface of the first bank BNL1, and the interval between the first electrode 21 and the second electrode 22 may be narrower than the interval between the first banks BNL1. At least a portion of the first electrode 21 and at least a portion of the second electrode 22 are directly on the first planarization layer 19, so that the first electrode 21 and the second electrode 22 may be on the same plane. However, the present disclosure is not limited thereto. In some cases, each of the electrodes 21 and 22 may have a width smaller than that of the first bank BNL1. However, each of the electrodes 21 and 22 may cover at least one side surface of the first bank BNL1 to reflect light emitted from the light emitting element 30.

Each of the electrodes 21 and 22 may include a conductive material (e.g., an electrically conductive material) having high reflectance. For example, each of the electrodes 21 and 22 may include a metal such as silver (Ag), copper (Cu), and/or aluminum (Al) as the conductive material having high reflectance, and/or may include an alloy containing aluminum (Al), nickel (Ni), and/or lanthanum (La). Each of the electrodes 21 and 22 may reflect the light emitted from the light emitting element 30 and proceeding to the side surface of the first bank BNL1 in the upward direction of each sub-pixel PXn.

However, the present disclosure is not limited thereto, and each of the electrodes 21 and 22 may further include a transparent conductive material. For example, each of the electrodes 21 and 22 may include a material such as indium tin oxide (ITO), indium zinc oxide (IZO), and/or indium tin zinc Oxide (ITZO). In some embodiments, each of the electrodes 21 and 22 may have a structure in which one or more transparent conductive material layers and one or more metal layers having high reflectivity are stacked, or may be formed as one layer including a transparent conductive material and/or a metal. For example, each of the electrodes 21 and 22 may have a stacked structure of ITO/Ag/ITO/, ITO/Ag/IZO, and/or ITO/Ag/ITZO/IZO.

The plurality of electrodes 21 and 22 may be electrically coupled to the light emitting elements 30, and a set or predetermined voltage may be applied to the electrodes 21 and 22 such that the light emitting elements 30 emit light. The plurality of electrodes 21 and 22 may be electrically coupled to the light emitting elements 30 through the contact electrodes CNE1 and CNE2, and may transmit electrical signals applied to the electrodes 21 and 22 to the light emitting elements 30 through the contact electrodes CNE1 and CNE2.

One of the first electrode 21 and the second electrode 22 may be electrically coupled to an anode electrode of the light emitting element 30, and the other thereof may be electrically coupled to a cathode electrode of the light emitting element 30. However, the present disclosure is not limited thereto, and vice versa.

Each of the electrodes 21 and 22 may be used to form an electric field in the sub-pixel PXn to align the light emitting element 30. The light emitting element 30 may be between the first electrode 21 and the second electrode 22 by an electric field formed on the first electrode 21 and the second electrode 22. The light emitting elements 30 of the display device 10 may be sprayed on the electrodes 21 and 22 through an inkjet printing process. When an ink including the light emitting elements 30 is sprayed on the electrodes 21 and 22, an alignment signal is applied to the electrodes 21 and 22 to form an electric field. The light emitting elements 30 dispersed in the ink may be aligned on the electrodes 21 and 22 by receiving an electrophoretic force by the electric field formed on the electrodes 21 and 22.

A first insulating layer PAS1 is on the first planarization layer 19. The first insulating layer PAS1 may cover the first banks BNL1, the first electrode 21, and the second electrode 22. The first insulating layer PAS1 may protect the first electrode 21 and the second electrode 22 and insulate them from each other. Further, the first insulating layer PAS1 may prevent or reduce damage to the light emitting elements 30 thereon from direct contact with other members.

In an embodiment, the first insulating layer PAS1 may include an opening OP partially exposing the first electrode 21 and the second electrode 22. Each opening OP may partially expose a portion of the electrodes 21 and 22 on the upper surface of the first bank BNL1. Some of the contact electrodes CNE1 and CNE2 may contact (e.g., physically contact) each of the electrodes 21 and 22 exposed through the opening OP.

The second bank BNL2 may be on the first insulating layer PAS1. The second bank BNL2 may include portions extending in the first direction DR1 and the second direction DR2 in a plan view, and may thus be in a grid pattern over the display area DPA. The second bank BNL2 may be located across the boundary of sub-pixels PXn to distinguish neighboring sub-pixels PXn.

Further, the second bank BNL2 is included so as to surround the light emission area EMA and the cut area CBA included for each sub-pixel PXn to distinguish them. The first electrode 21 and the second electrode 22 may extend in the second direction DR2 and may be located across a portion of the second bank BNL2 extending in the first direction DR1. A portion of the second bank BNL2 extending in the second direction DR2, for example, a portion between the light emission areas EMA, may have a larger width than a portion between the cut areas CBA. Accordingly, the distance between the cut areas CBA may be smaller than the distance between the light emission areas EMA.

The second bank BNL2 may be formed to have a greater height than the first bank BNL1. The second bank BNL2 may prevent or reduce overflowing of ink to the adjacent sub-pixel PXn in the inkjet printing process of the process of manufacturing the display device 10, thereby separating inks in which different light emitting elements are dispersed for different sub-pixels PXn such that these inks are not mixed with each other. Like the first bank BNL1, the second bank BNL2 may include polyimide (PI), but the material thereof is not limited thereto.

The light emitting element 30 may be on the first insulating layer PAS1. The plurality of light emitting devices 30 may be spaced apart from each other along the second direction DR2 in which the electrodes 21 and 22 extend, and may be substantially aligned in parallel (e.g., substantially in parallel) with each other. The light emitting element 30 may have a shape extending in one direction, and the direction in which each of the electrodes 21 and 22 extends may be substantially perpendicular to the direction in which the light emitting element 30 extends. However, the present disclosure is not limited thereto, and the light emitting element 30 may be located obliquely at a set or predetermined angle without being perpendicular to the direction in which each of the electrodes 21 and 22 extends.

The light emitting elements 30 in each sub-pixel PXn may include light emitting layers ('36' in FIG. 9) containing different materials to emit light of different wavelengths to the outside. Accordingly, light of the first color, light of the second color, and light of the third color may be emitted from the first sub-pixel PX1, the second sub-pixel PX2, and the third sub-pixel PX3, respectively. However, the present disclosure is not limited thereto, and each of the sub-pixels PXn includes the same type (or kind) of light emitting elements 30 to emit light of substantially the same color.

Both ends of the light emitting element 30 may be on the electrodes 21 and 22 between the first banks BNL1. The extended length of the light emitting element 30 is longer than the distance between the first electrode 21 and the second electrode 22, and both ends of the light emitting element 30 may be on the first electrode 21 and the second electrode 22, respectively. For example, one end of the light emitting element 30 may be on the first electrode 21, and the other end thereof may be on the second electrode 22.

The light emitting element 30 may be provided with a plurality of layers in a direction perpendicular (e.g., substantially perpendicular) to the upper surface of the substrate 11 or the first planarization layer 19. The light emitting element 30 is located such that one extending direction is parallel (e.g., substantially parallel) to the upper surface of the first planarization layer 19, and the plurality of semiconductor layers included in the light emitting element 30 may be sequentially arranged along a direction parallel (e.g., substantially parallel) to the upper surface of the first planarization layer 19. However, the present disclosure is not limited thereto. In some cases, when the light emitting element 30 has a different structure, the plurality of semiconductor layers may be arranged in a direction perpendicular (e.g., substantially perpendicular) to the first planarization layer 19.

Both ends of the light emitting element 30 may contact (e.g., physically contact) the contact electrodes CNE1 and CNE2, respectively. For example, the light emitting element 30 may not be provided with an insulating film ('38' in FIG. 9) on the end surface in one direction, and a portion of the semiconductor layer ('31', '32' in FIG. 9) and a portion of the electrode layer ('37' in FIG. 9) may be exposed, and thus the exposed semiconductor layer ('31', '32' in FIG. 9) and electrode layer ('37' in FIG. 9) may contact (e.g., physically contact) the contact electrodes CNE1 and CNE2. However, the present disclosure is not limited thereto, and in the light emitting element, at least a portion of the insulating film 38 may be removed, so that both side surfaces of the semiconductor layer ('31', '32' in FIG. 9) may be partially exposed. The exposed side surface of the semiconductor layer ('31', '32' in FIG. 9) may directly contact the contact electrodes CNE1 and CNE2.

A plurality of contact electrodes CNE1 and CNE2 may be on the light emitting element 30. The plurality of contact electrodes CNE1 and CNE2 may have a shape extending in one direction, and may be on each of the electrodes 21 and 22. The contact electrodes CNE1 and CNE2 may include a first contact electrode CNE1 on the first electrode 21 and a second contact electrode CNE2 on the second electrode 22. The contact electrodes CNE1 and CNE2 may be spaced apart from each other and face each other. For example, the first contact electrode CNE1 and the second contact electrode CNE2 may be on the first electrode 21 and the second electrode 22, respectively, and may be spaced apart from each other in the first direction DR1. Each of the contact electrodes CNE1 and CNE2 may form a stripe pattern in the light emission area EMA of each sub-pixel PXn.

Each of the plurality of contact electrodes CNE1 and CNE2 may contact (e.g., physically contact) the light emitting element 30. The first contact electrode CNE1 may contact one end of the light emitting element 30, and the second contact electrode CNE2 may contact (e.g., physically contact) the other end of the light emitting element 30. In the light emitting element 30, a semiconductor layer is exposed on both end surfaces in an extending direction, and the contact electrodes CNE1 and CNE2 may be in electrical contact with the semiconductor layer of the light emitting element 30. The first contact electrode CNE1 may contact (e.g., physically contact) the first electrode 21 through an opening OP exposing a portion of the upper surface of the first electrode 21, and the second contact electrode CNE2 may contact (e.g., physically contact) the second electrode 22 through an opening OP exposing a portion of the upper surface of the second electrode 22.

The width of each of the contact electrodes CNE1 and CNE2 measured in one direction (e.g., in the first direction DR1) may be smaller than the width of each of the electrodes 21 and 22 measured in the one direction. Each of the contact electrodes CNE1 and CNE2 may contact (e.g., physically contact) one end and the other end of the light emitting element 30 and cover a portion of the upper surface of each of the first electrode 21 and the second electrode 22. However, the present disclosure is not limited thereto, and the contact electrodes CNE1 and CNE2 may be formed to have larger widths than the electrodes 21 and 22 to cover both sides of the electrodes 21 and 22.

The contact electrodes CNE1 and CNE2 may include a transparent conductive material. For example, the contact electrodes CNE1 and CNE2 may include ITO, IZO, ITZO, and/or aluminum (Al). The light emitted from the light emitting element 30 may pass through the contact electrodes CNE1 and CNE2 and proceed toward the electrodes 21 and 22. However, the present disclosure is not limited thereto.

Although it is shown in the drawings that two contact electrodes CNE1 and CNE2 are in one sub-pixel PXn, the present disclosure is not limited thereto. The number of contact electrodes CNE1 and CNE2 may be changed depending on the number of electrodes 21 and 22 included for each sub-pixel PXn.

The second insulating layer PAS2 covers the first contact electrode CNE1. The second insulating layer PAS2 may include a first contact electrode CNE1 to cover one side on which the first contact electrode CNE1 is located. For example, the second insulating layer PAS2 may cover the first insulating layer PAS1 on the first contact electrode CNE1 and the first electrode 21. Such an arrangement may be formed by a process of partially removing an insulating material layer to form the second contact electrode CNE2 after entirely placing the insulating material layer forming the second insulating layer PAS2 in the light emission area EMA. One side of the second contact electrode CNE2 may be on the second insulating layer PAS2, and the second contact electrode CNE2 may be insulated from the first contact electrode CNE1 with the second insulating layer PAS2 therebetween.

A third insulating layer PAS3 may be entirely in the display area DPA of the substrate 11. The third insulating layer PAS3 may function to protect the members on the first substrate 11 from external environments. However, the third insulating layer PAS3 may be omitted.

Each of the above-described first insulating layer PAS1, second insulating layer PAS2, and third insulating layer PAS3 may include an inorganic insulating material and/or an organic insulating material. For example, each of the first insulating layer PAS1, the second insulating layer PAS2, and the third insulating layer PAS3 may include an inorganic insulating layer such as silicon oxide (SiOx), silicon nitride (SiNx), silicon oxynitride (SiOxNy), aluminum oxide ($Al_2O_3$), and/or aluminum nitride (AlN). In one or more embodiments, each of the first insulating layer PAS1, the second insulating layer PAS2, and the third insulating layer PAS3 may include an organic insulating layer such as acrylic resin, epoxy resin, phenol resin, polyamide resin, polyimide resin, unsaturated polyester resin, polyphenylene resin, polyphenylene sulfide resin, benzocyclobutene, cardo resin, siloxane resin, silsesquioxane resin, polymethyl methacrylate, polycarbonate, and/or polymethyl methacrylate-polycarbonate synthetic resin. However, the present disclosure is not limited thereto.

In one or more embodiments of the spraying process of a light emitting element ink for aligning the light emitting elements 30, a first spraying process may be performed in the light emission area E A, and then a second spraying process may be performed in the light emission area EMA to increase the number of light emitting elements 30. However, there is a problem that the light emitting elements 30 mounted on the electrodes 21 and 22 may be detached by the movement of the substrate 11 for the secondary spraying process or by an external force.

In an embodiment, a light emitting element ink containing a reactive mesogen may be formed and printed on the substrate 11 to form a plurality of protrusions in contact (e.g., physically contact) between the light emitting element 30 and the first insulating layer PAS1, thereby fixing the light emitting element 30. A light emitting element ink and a method of manufacturing a display device will be described further herein below, and structures of a plurality of protrusions will be described with reference to the drawings.

Figure 4:
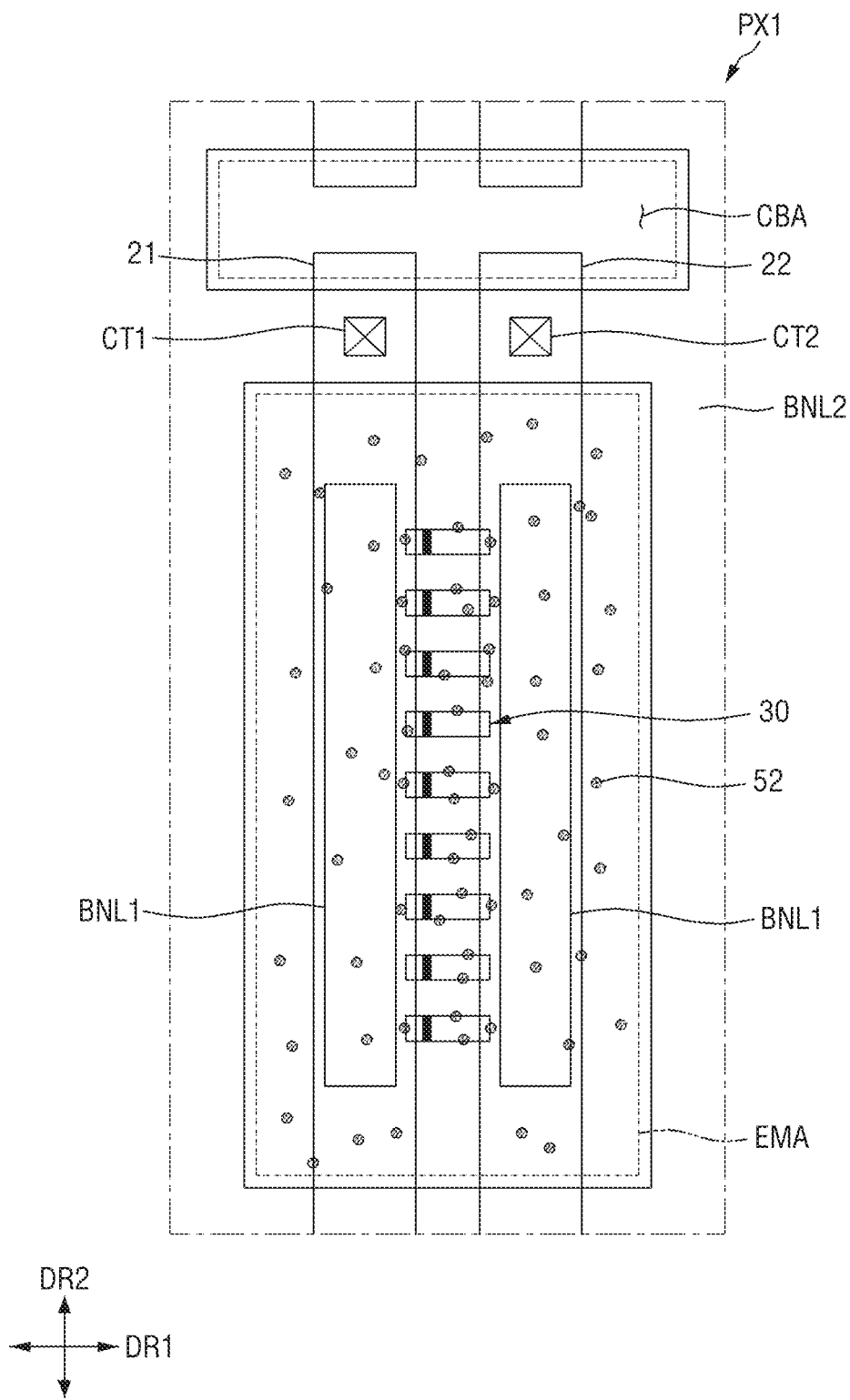
FIG. 4 is a plan view illustrating one sub-pixel according to an embodiment.
Figure 5:
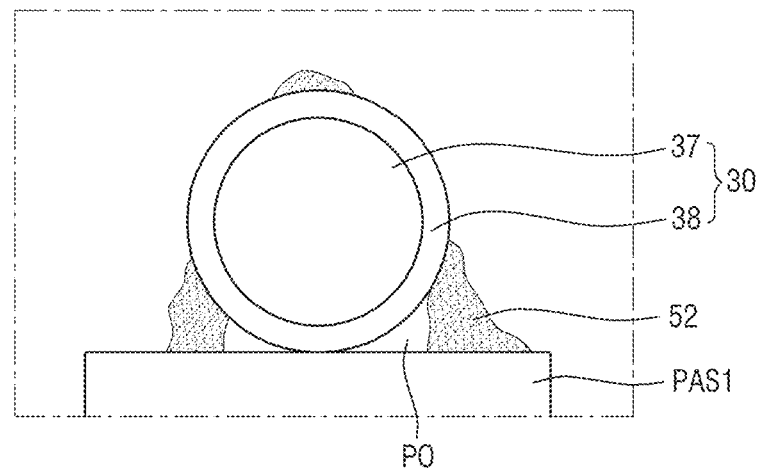
FIG. 5 is a schematic side view of a light emitting element of a display device according to an embodiment.
Figure 6:
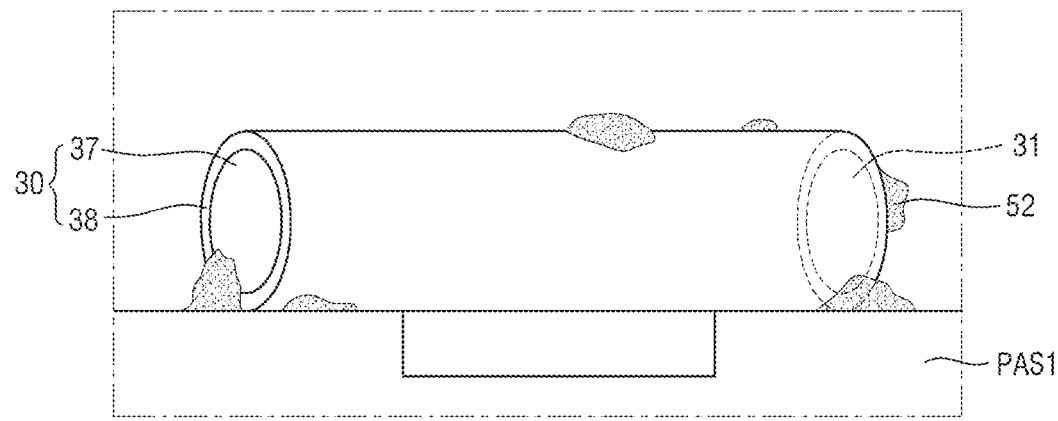
FIG. 6 is a schematic perspective view of a light emitting element of a display device according to an embodiment.
Figure 7:
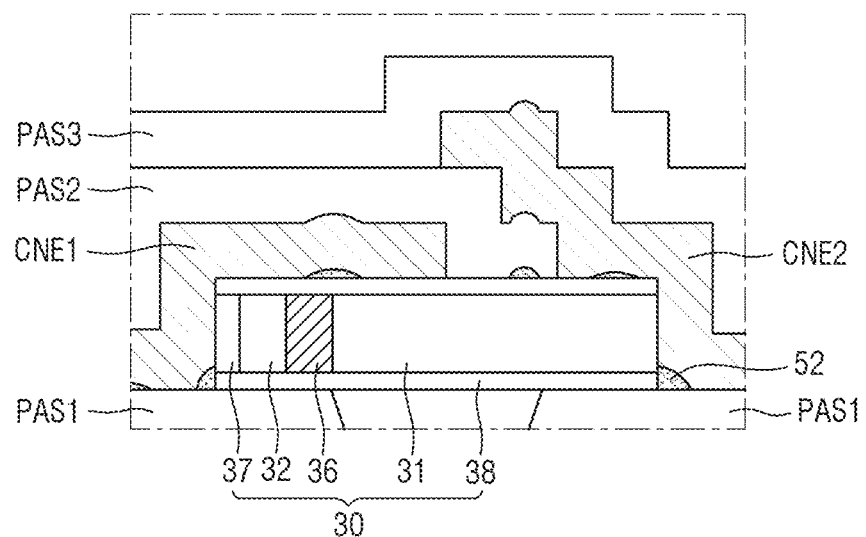
FIG. 7 is an enlarged cross-sectional view of an area of a display device according to an embodiment.
Figure 8:
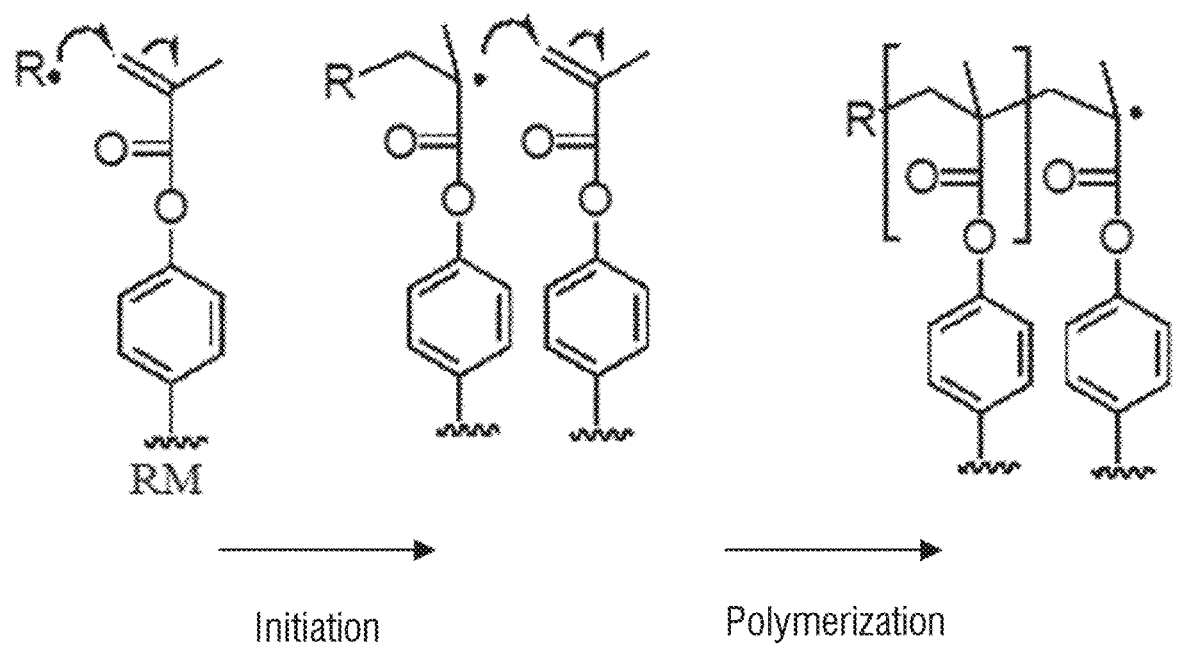
FIG. 8 is a view schematically illustrating a polymerization reaction of a reactive mesogen according to an embodiment.
Figure 9:
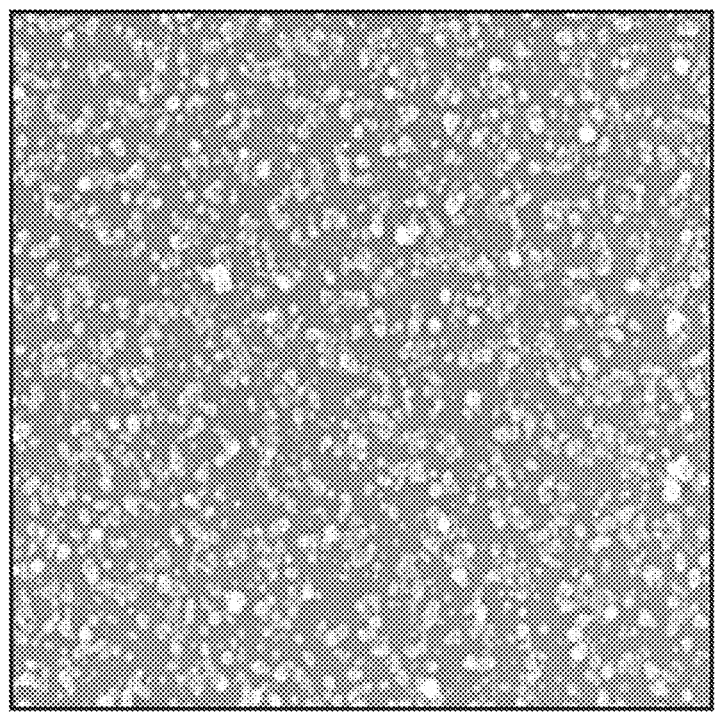
FIG. 9 is an image illustrating a plurality of protrusions according to an embodiment.

FIG. 4 is a plan view illustrating one sub-pixel according to an embodiment. FIG. 5 is a schematic side view of a light emitting element of a display device according to an embodiment. FIG. 6 is a schematic perspective view of a light emitting element of a display device according to an embodiment. FIG. 7 is an enlarged cross-sectional view of an area of a display device according to an embodiment. FIG. 8 is a view schematically illustrating a polymerization reaction of a reactive mesogen according to an embodiment. FIG. 9 is an image illustrating a plurality of protrusions according to an embodiment.

Referring to FIG. 4 together with FIG. 3, the display device 10 according to an embodiment may include a plurality of protrusions 52 on the first insulating layer PAS1 and the light emitting element 30.

The plurality of protrusions 52 may be entirely arranged in the light emission area EMA of the sub-pixel PX1 partitioned by the second bank BNL2. The plurality of protrusions 52 may not be arranged on the cut area CBA and the second bank BNL2. The plurality of protrusions 52 may be arranged to overlap the first electrode 21, the second electrode 22, and the first banks BNL1.

The plurality of protrusions 52 may be spaced apart from each other and may be randomly arranged. Each of the plurality of protrusions 52 may have a set or predetermined thickness and width, and the thickness and width may be several nanometers to several tens of nanometers. The thickness and width of each of the plurality of protrusions 52 may be made randomly within the above range.

The plurality of protrusions 52 may be arranged on the first insulating layer PAS1 and the light emitting element 30, and may be in direct contact (e.g., physical contact) with the first insulating layer PAS1 and the light emitting element 30. For example, the lower surfaces of the plurality of protrusions 52 may be in contact (e.g., physical contact) with the upper surface of the first insulating layer PAS1. Further, the upper surfaces of the plurality of protrusions 52 may be in contact (e.g., physical contact) with the side surface of the light emitting element 30. Further, the plurality of protrusions 52 may be arranged to overlap the light emitting element 30. The plurality of protrusions 52 may be continuously in direct contact (e.g., physical contact) with the first insulating layer PAS1 and the light emitting element 30 to attach and fix the light emitting element 30 onto the first insulating layer PAS1. Thus, detachment of the light emitting element 30 may be prevented (or a likelihood or occurrence of such detachment may be reduced) in the secondary spraying process of the light emitting element ink 200 performed after the process of aligning the light emitting elements 30.

Referring to FIG. 5, the plurality of protrusions 52 may be arranged between the light emitting element 30 and the first insulating layer PAS1, and may be in contact (e.g., physical contact) with the light emitting element 30 and the first insulating layer PAS1, respectively. For example, one of the plurality of protrusions 52 may have one surface in contact (e.g., physical contact) with the insulating film ('38' in FIG. 10) of the light emitting element 30, and the other surface, for example, a lower surface, in contact (e.g., physical contact) with the upper surface of the first insulating layer PAS1.

At least some of the plurality of protrusions 52 may be arranged to overlap the light emitting element 30 and the first insulating layer PAS1, and the plurality of protrusions 52 may not be arranged in a portion of an area between the light emitting element 30 and the first insulating layer PAS1, and a void PO may be formed therein. Because the plurality of protrusions 52 are formed by polymerization by ultraviolet light (UV) irradiation, the plurality of protrusions 52 may be formed only in an area where UV can be irradiated. Because UV is not irradiated in an area where the light emitting element 30 contacts (e.g., physically contacts) the first insulating layer PAS1, the plurality of protrusions 52 are not formed, so that a void PO may be formed.

Referring to FIGS. 6 and 7, the plurality of protrusions 52 may be in contact (e.g., physical contact) with at least one end of the light emitting element 30 and be in contact (e.g., physical contact) with the upper surface of the first insulating layer PAS1 to attach and fix the light emitting element 30. For example, the protrusion 52 may be in contact (e.g., physical contact) with the insulating film 38 and electrode layer 37 of the light emitting element 30. Further, the protrusion 52 may be in contact (e.g., physical contact) with the insulating film 38 and first semiconductor layer 31 of the light emitting element 30.

The plurality of protrusions 52 may be arranged on the light emitting element 30, and may be arranged between the light emitting element 30 and the first contact electrode CNE1, between the light emitting element 30 and the second insulating layer PAS2, and/or between the light emitting element 30 and the second contact electrode CNE2. For example, the plurality of protrusions 52 may be arranged between the insulating film 38 of the light emitting element 30 and the first contact electrode CNE1, and may be in contact (e.g., physical contact) with the insulating film 38 of the light emitting element 30 and the first contact electrode CNE1, respectively. Further, the plurality of protrusions 52 may be arranged between the insulating film 38 of the light emitting element 30 and the second contact electrode CNE2, and may be in contact (e.g., physical contact) with the insulating film 38 of the light emitting element 30 and the second contact electrode CNE2, respectively.

Further, the plurality of protrusions 52 may be arranged between ends of the light emitting element 30 and the first contact electrode CNE1 and between ends of the light emitting element 30 and the second contact electrode CNE2. For example, the plurality of protrusions 52 may be arranged between the insulating film 38 and the first contact electrode CNE1 and between the electrode layer 37 and the first contact electrode CNE1 at one end of the light emitting element 30, and may be in contact (e.g., physical contact) with the insulating film 38 and electrode layer 37 of the light emitting element 30, the first contact electrode CNE1, and the first insulating layer PAS1, respectively. Further, the plurality of protrusions 52 may be arranged between the insulating film 38 and the second contact electrode CNE2 and between the first semiconductor layer 31 and the second contact electrode CNE2 at the other end of the light emitting element 30, and may be in contact (e.g., physical contact) with the insulating film 38 and first semiconductor layer 31 of the light emitting element 30, the second contact electrode CNE2, and the first insulating layer PAS1, respectively.

The electrode layer 37 at one end of the light emitting element 30 may be in contact (e.g., physical contact) with the first contact electrode CNE1, and the first semiconductor layer 31 at the other end of the light emitting element 30 may be in contact (e.g., physical contact) with the second contact electrode CNE2, so that a light emission signal may be applied to the light emitting element 30. As described above, even when the plurality of protrusions 52 are arranged to be in contact (e.g., physical contact) with one end or the other end of the light emitting element 30, the size of the protrusion 52 is only several nanometers to several tens of nanometers, so that the protrusion 52 does not affect the light emission of the light emitting element 30.

The plurality of protrusions 52 may be made of a polymer resin. The polymer resin may be a polymer resin in which a reactive mesogen is polymerized. The reactive mesogen may include at least one selected from a diacrylate-based monomer, an acrylate-based monomer, and an epoxy-based monomer. The polymer resin in which a reactive mesogen is polymerized may include at least one selected from a diacrylate resin, an acrylate resin, and an epoxy resin.

For example, the reactive mesogen may include a compound represented by Formula 1 below.

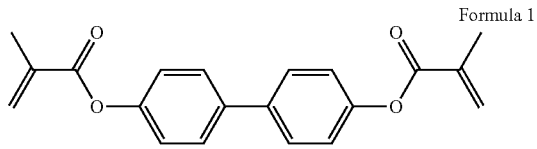 [SMILES: C=C(C)C(=O)Oc1ccc(-c2ccc(OC(=O)C(=C)C)cc2)cc1]

Formula 1

The plurality of protrusions 52 may be formed by polymerizing the reactive mesogen by UV irradiation after spraying a light emitting element ink containing the reactive mesogen, which will be described further herein below, onto a substrate.

Referring to FIGS. 8 and 9, when the reactive mesogen RM is irradiated with UV, the acrylic reactive groups at the ends of the reactive mesogen RM are polymerized with each other to form a polymer. The polymer may form a polymer network to form a plurality of protrusions 52. The plurality of protrusions 52 may be randomly arranged to be spaced apart from each other, and the width and thickness thereof may be random. The width and thickness of the plurality of protrusions 52 may be adjusting by adjusting the content (e.g., amount or weight) of reactive mesogen in the light emitting element ink.

As described above, in the display device 10 according to an embodiment, the plurality of protrusions 52 may be formed on the first insulating layer PAS1 and the light emitting element 30, so that the light emitting element 30 may be attached and fixed to the first insulating layer PAS1, thereby preventing the detachment (or thereby reducing a likelihood or occurrence of such detachment) of the light emitting element 30 during the process.

Figure 10:
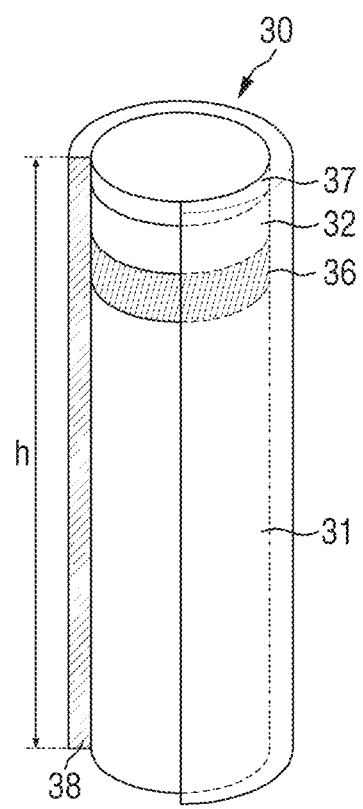
FIG. 10 is a schematic view of a light emitting element according to an embodiment.

FIG. 10 is a schematic view of a light emitting element according to an embodiment.

The light emitting element 30 may be a light emitting diode, and, for example, may be an inorganic light emitting diode having a size of micrometer or nanometer (e.g., having a size in a micrometer range or a nanometer range) and including an inorganic material. The inorganic light emitting diode may be aligned between two electrodes having a polarity formed when an electric field is formed between the two electrodes facing each other in a set or specific direction. The light emitting element 30 may be aligned between two electrodes by an electric field formed thereon.

The light emitting element 30 according to an embodiment may have a shape extending in one direction. The light emitting element 30 may have a shape such as a cylinder, a rod, a wire, or a tube. However, the shape of the light emitting element 30 is not limited thereto, and the light emitting element 30 may have a shape of a polygonal column such as a cube, a rectangular parallelepiped, or a hexagonal column, or may have a shape extending in one direction and having a partially inclined outer surface. For example, the light emitting element 30 may have various suitable shapes. A plurality of semiconductor layers included in the light emitting element 30, which will be described further herein below, may be sequentially arranged or stacked along one direction.

The light emitting element 30 may include semiconductor layers doped with any suitable conductive type (for example, p-type or n-type) impurity. The semiconductor layers may receive an electrical signal applied from an external power source and emit light of a set or specific wavelength band.

Referring to FIG. 10, the light emitting element 30 may include a first semiconductor layer 31, a second semiconductor layer 32, a light emitting layer 36, an electrode layer 37, and an insulating film 38.

The first semiconductor layer 31 may be an n-type semiconductor layer. When the light emitting element 30 emits light of a blue wavelength band, the first semiconductor layer 31 may include a semiconductor material having a chemical formula of $Al_xGa_yIn_{1-x-y}N$ ($0 \le x \le 1$, $0 \le y \le 1$, $0 \le x+y \le 1$). For example, the semiconductor material may be at least one selected from AlGaInN, GaN, AlGaN, InGaN, AlN, and InN, each being doped with n-type impurities. The first semiconductor layer 31 may be doped with an n-type dopant. The n-type dopant may be Si, Ge, and/or Sn. For example, the first semiconductor layer 31 may be n-GaN doped with n-type Si. The length of the first semiconductor layer 31 may have a range of 1.5 μm to 5 μm, but is not limited thereto.

The second semiconductor layer 32 is on the light emitting layer 36 to be described further herein below. The second semiconductor layer 32 may be a p-type semiconductor layer. When the light emitting element 30 emits light of a blue wavelength band or a green wavelength band, the second semiconductor layer 32 may include a semiconductor material having a composition ratio of $Al_xGa_yIn_{1-x-y}N$ (here, $0 \le x \le 1$, $0 \le y \le 1$, $0 \le x+y \le 1$). For example, the semiconductor material may be at least one selected from AlGaInN, GaN, AlGaN, InGaN, AlN, and InN, each being doped with p-type impurities. The second semiconductor layer 32 may be doped with a p-type dopant. The p-type dopant may be Mg, Zn, Ca, Se, and/or Ba. For example, the second semiconductor layer 32 may be p-GaN doped with p-type Mg. The length of the second semiconductor layer 32 may have a range of 0.05 μm to 0.10 μm, but is not limited thereto.

Although it is shown in FIG. 4 that each of the first semiconductor layer 31 and the second semiconductor layer 32 is formed as one layer, the present disclosure is not limited thereto. Each of the first semiconductor layer 31 and the second semiconductor layer 32 may further include a larger number of layers, for example, clad layers and/or tensile strain barrier reducing (TSBR) layers according to the material of the light emitting layer 36.

The light emitting layer 36 is between the first semiconductor layer 31 and the second semiconductor layer 32. The light emitting layer 36 may include a material of a single or multiple quantum well structure. When the light emitting layer 36 includes a material of a multiple quantum well structure, the light emitting layer 36 may have a structure in which quantum layers and well layers are alternately stacked. The light emitting layer 36 may emit light by the combination of electron-hole pairs according to an electrical signal applied through the first semiconductor layer 31 and the second semiconductor layer 32. When the light emitting layer 36 emits light of a blue wavelength band, the light emitting layer 36 may include a material such as AlGaN and/or AlGaInN. In one or more embodiments, when the light emitting layer 36 has a multiple quantum well structure in which quantum layers and well layers are alternately stacked, the quantum wells may include a material such as AlGaN and/or AlGaInN, and the well layers may include a material such as GaN and/or AlInN. For example, the light emitting layer 36 includes quantum wells each containing AlGaInN and well layers each containing AlInN, and thus the light emitting layer 36 may emit blue light having a central wavelength band of 450 nm to 495 nm as described above.

However, the present disclosure is not limited thereto, and the light emitting layer 36 may have a structure in which semiconductor materials having high bandgap energy and semiconductor materials having low bandgap energy are alternately stacked, and may include other group 3 to group 5 semiconductor materials depending on the wavelength bad of light. The light emitted from the light emitting layer 36 is not limited to light of a blue wavelength band, and in some cases, the light emitting layer 36 may emit light of a red or green wavelength band. The length of the light emitting layer 36 may have a range of 0.05 μm to 0.10 μm, but is not limited thereto.

In one or more embodiments, the light emitted from the light emitting layer 36 may be emitted to both side surfaces of the light emitting element 30 as well as the longitudinal outer surface of the light emitting element 30. The direction of the light emitted from the light emitting layer 36 is not limited to one direction.

The electrode layer 37 may be an ohmic contact electrode. However, the present disclosure is not limited thereto, and the electrode layer 37 may be a Schottky contact electrode. The light emitting element 30 may include at least one electrode layer 37. Although it is shown in FIG. 10 that the light emitting element 30 includes one electrode layer 37, the present disclosure is not limited thereto. In some cases, the light emitting element 30 may include a larger number of electrode layers 37, or the electrode layer 37 may be omitted. A description of the light emitting element 30 to be described further herein below may be equally applied even if the number of electrode layers 37 is changed or the light emitting element 30 further includes other structures.

When the light emitting element 30 is electrically coupled to an electrode or a contact electrode in the display device 10 according to an embodiment, the electrode layer 37 may reduce resistance between the light emitting element 30 and the electrode or the contact electrode. The electrode layer 37 may include a conductive metal (e.g., an electrically conductive metal). For example, the electrode layer 37 may include at least one selected from aluminum (Al), titanium (Ti), indium (In), gold (Au), silver (Ag), indium tin oxide (ITO), indium zinc oxide (IZO), and indium tin-zinc oxide (ITZO). The electrode layer 37 may include a semiconductor material doped with n-type or p-type impurities. The electrode layer 37 may include the same material, and may include different materials from each other, but the present disclosure is not limited thereto.

The insulating film 38 surrounds the outer surfaces of the above-described semiconductor layers and electrode layers. For example, the insulating film 38 may surround at least the outer surface of the light emitting layer 36, and may extend in one direction in which the light emitting element 30 extends. The insulating film 38 may function to protect the members of the light emitting element 30. For example, the insulating film 38 may be formed to surround the side surfaces of the members, and may be formed such that both ends of the light emitting element 30 in a length direction are exposed.

Although it is shown in FIG. 9 that the insulating film 38 may extend in the length direction of the light emitting element 30 to cover the first semiconductor layer 31 to the side surface of the electrode layer 37, the present disclosure is not limited thereto. The insulating film 38 may cover only the outer surface of a portion of the semiconductor layer as well as the light emitting layer 36 or cover only a portion of the outer surface of the electrode layer 37 to partially expose the outer surface of the electrode layer 37. The insulating film 38 may be formed to have a rounded cross-sectional upper surface in an area adjacent to at least one end of the light emitting element 30.

The thickness of the insulating film 38 may have a range of 10 nm to 1.0 μm, but is not limited thereto. For example, the thickness of the insulating film 38 may be about 40 nm.

The insulating film 38 may include a material having insulating properties, for example, silicon oxide (SiOx), silicon nitride (SiNx), silicon oxynitride (SiOxNy), aluminum nitride (AlN), and/or aluminum oxide ($Al_2O_3$). Accordingly, the light emitting layer 36 may prevent an electrical short (or may reduce a likelihood or occurrence of an electrical short) that may occur when the light emitting layer 36 is in direct contact (e.g., physical contact) with an electrode through which an electrical signal is transmitted to the light emitting element 30. Further, because the insulating film 38 protects the outer surface of the light emitting element 30 as well as the light emitting layer 36, it is possible to prevent or reduce the deterioration in light emission efficiency.

Further, the outer surface of the insulating film 38 may be surface-treated. The light emitting elements 30 may be aligned by being sprayed onto the electrodes in a state in which they are dispersed in a set or predetermined ink. Here, the surface of the insulating film 38 may be hydrophobically or hydrophilically treated in order to maintain the light emitting elements 30 in a dispersed state without being aggregated with other adjacent light emitting elements 30 in the ink. For example, the outer surface of the insulating film 38 may be surface-treated with a material such as stearic acid and/or 2,3-naphthalene dicarboxylic acid.

The light emitting element 30 may have a length h of 1 μm to 10 μm, 2 μm to 6 μm, or, for example, 3 μm to 5 μm. Further, the light emitting element 30 may have diameter of 30 nm to 700 nm, and may have an aspect ratio of 1.2 to 100. However, the present disclosure is not limited thereto, and the plurality of light emitting elements 30 included in the display device 10 may have different diameters according to a difference in composition of the light emitting layer 36. For example, the light emitting element 30 may have a diameter of about 500 nm.

In one or more embodiments, the shape and material of the light emitting element 30 are not limited to FIG. 10. In some embodiments, the light emitting element 30 may include a larger number of layers or may have other shapes.

In one or more embodiments, the light emitting elements 30 may be sprayed onto each of the electrodes 21 and 22 through an inkjet printing process. The light emitting elements 30 may be dispersed in a solvent to be prepared in an ink state, sprayed on the electrodes 21 and 22, and arranged between the electrodes 21 and 22 through a process of applying an alignment signal to the electrodes 21 and 22. When an alignment signal is applied to each of the electrodes 21 and 22, an electric field may be formed on the electrodes 21 and 22, and the light emitting element 30 may receive a dielectrophoretic force due to the electric field. The light emitting element 30 to which the dielectrophoretic force is transmitted may be on the first electrode 21 and the second electrode 22 while the alignment direction and position thereof are changed.

According to an embodiment, an light emitting element ink including the light emitting elements 30 may include a reactive mesogen and form a plurality of protrusions 52 on the light emitting element 30 and the first insulating layer PAS1. Accordingly, it is possible to prevent the detachment (or to reduce a likelihood or occurrence of the detachment) of the light emitting element 30, which may be caused by movement of the substrate 11 and/or an external force after the first printing process.

Hereinafter, the ink including the light emitting elements 30 will be described further.

Figure 11:
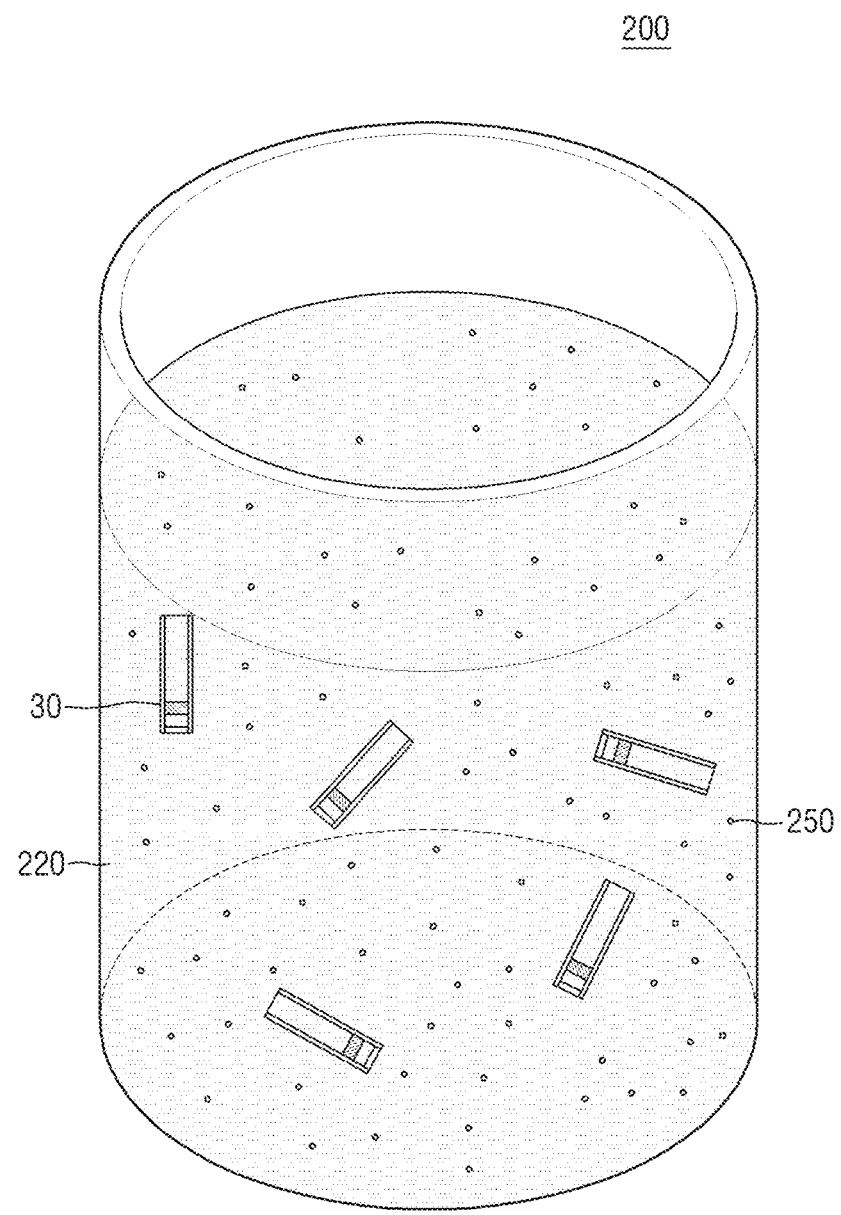
FIG. 11 is a schematic view of a light emitting element ink according to an embodiment.

FIG. 11 is a schematic view of a light emitting element ink according to an embodiment.

Referring to FIG. 11, a light emitting element ink 200 according to an embodiment includes a solvent 220, light emitting elements 30 dispersed in the solvent 220, and reactive mesogens 250. The light emitting element 30 may be the light emitting element 30 described above with reference to FIG. 10, and the light emitting element 30 of FIG. 10 is illustrated in the drawings. Because the description of the light emitting element 30 is the same as that described above, hereinafter, the solvent 220 and the reactive mesogen 250 will be described in more detail.

The solvent 220 may store the light emitting elements 30 each including semiconductor layers in a dispersed state, and may be an organic solvent that does not react with the light emitting elements 30. The solvent 100 may have a viscosity sufficient to be discharged through a nozzle of an inkjet printing apparatus in a liquid state. The solvent molecules of the solvent 100 may disperse the light emitting elements 30 while surrounding the light emitting elements 30 on the surface thereof. The light emitting element ink 200 may include the light emitting elements 30 to be prepared in a solution or colloid state.

In an embodiment, examples of the solvent 100 may include, but are not limited to, acetone, water, alcohol, toluene, propylene glycol (PG) and/or propylene glycol methyl acetate (PGMA), triethylene glycol monobutyl ether (TGBE), diethylene glycol monophenyl ether (DGPE), amide-based solvents, dicarbonyl-based solvents, diethylene glycol dibenzoate, tricarbonyl-based solvents, triethyl citrate, phthalate-based solvents, benzyl butyl phthalate, bis(2-ethylhexyl) phthalate, bis(2-ethylhexyl) isophthalate, bis(2-ethylhexyl) isophthalate, and ethylphthalyl ethyl glycolate.

The reactive mesogens 250 may be dispersed in the solvent 220 together with the light emitting elements 30. A set or predetermined amount of the reactive mesogens 250 is included in the light emitting element ink 200 to form a plurality of protrusions 52 after the light emitting elements 30 are aligned.

According to an embodiment, the reactive mesogen included in the light emitting element ink 200 may include at least one selected from a diacrylate-based monomer, an acrylate-based monomer, and an epoxy-based monomer. When using the above-described light emitting element ink 200 including the reactive mesogen 250, the plurality of protrusions 52 for attaching and fixing the light emitting element 30 are formed after the light emitting elements 30 are aligned, so that detachment of the light emitting element 30 may be prevented or reduced.

The light emitting element ink 200 may include the light emitting elements 30 in a set or predetermined amount per unit weight, and the reactive mesogens may be included in a set or predetermined amount based on the weight of the light emitting element ink 200.

According to an embodiment, the light emitting element ink 200 may include 0.1 parts by weight to 1 part by weight of the reactive mesogens 250 based on 100 parts by weight of the light emitting element ink 200. When the amount of the reactive mesogens 250 is 0.1 parts by weight or more based on 100 parts by weight of the light emitting element ink 200, a plurality of protrusions 52 may be formed with an effective thickness on the light emitting element 30 and the first insulating layer PAS1, and when the amount of the reactive mesogens 250 is 1 parts by weight or less based on 100 parts by weight of the light emitting element ink 200, a difficulty in spraying of the light emitting element ink 200 due to high viscosity may be prevented or reduced.

The content of the light emitting elements 30 included in the light emitting element ink 200 may be changed depending on the number of the light emitting elements 30 per unit droplet of the light emitting element ink 200 discharged through a nozzle during a printing process. In an embodiment, the light emitting elements 30 may be included in an amount of 0.01 parts by weight to 1 part by weight based on 100 parts by weight of the light emitting element ink 200. However, this is just an example content (e.g., amount or weight) of the light emitting elements 30, and the content (e.g., amount or weight) of the light emitting elements 30 may be changed depending on the number of light emitting elements 30 per unit droplet of the light emitting element ink 200.

The light emitting element ink 200 may further include a dispersant that improves the degree of dispersion of the light emitting elements 30. The kind of the dispersant is not particularly limited, and the dispersant may be added in an appropriate or suitable amount to further disperse the light emitting elements 30. For example, the dispersant may be included in an amount of 10 parts by weight to 50 parts by weight based on 100 parts by weight of the light emitting element 30. However, the amount thereof is not limited thereto.

When manufacturing a product including the light emitting elements 30 and the reactive mesogens 250 by using the light emitting element ink 200 according to an embodiment, a uniform (e.g., substantially uniform) number of light emitting elements 30 may be included per unit area, and the solvent 220 and unreacted reactive mesogen 250 remaining as foreign substances may be completely (or substantially completely) removed in a subsequent process.

During the process of manufacturing the display device 10, a process of arranging the light emitting elements 30 on the electrodes 21 and 22 may be performed, and this process may be performed through a printing process using the light emitting element ink 200.

Hereinafter, a process of manufacturing the display device 10 according to an embodiment will be described with further reference to additional drawings.

Figure 12:
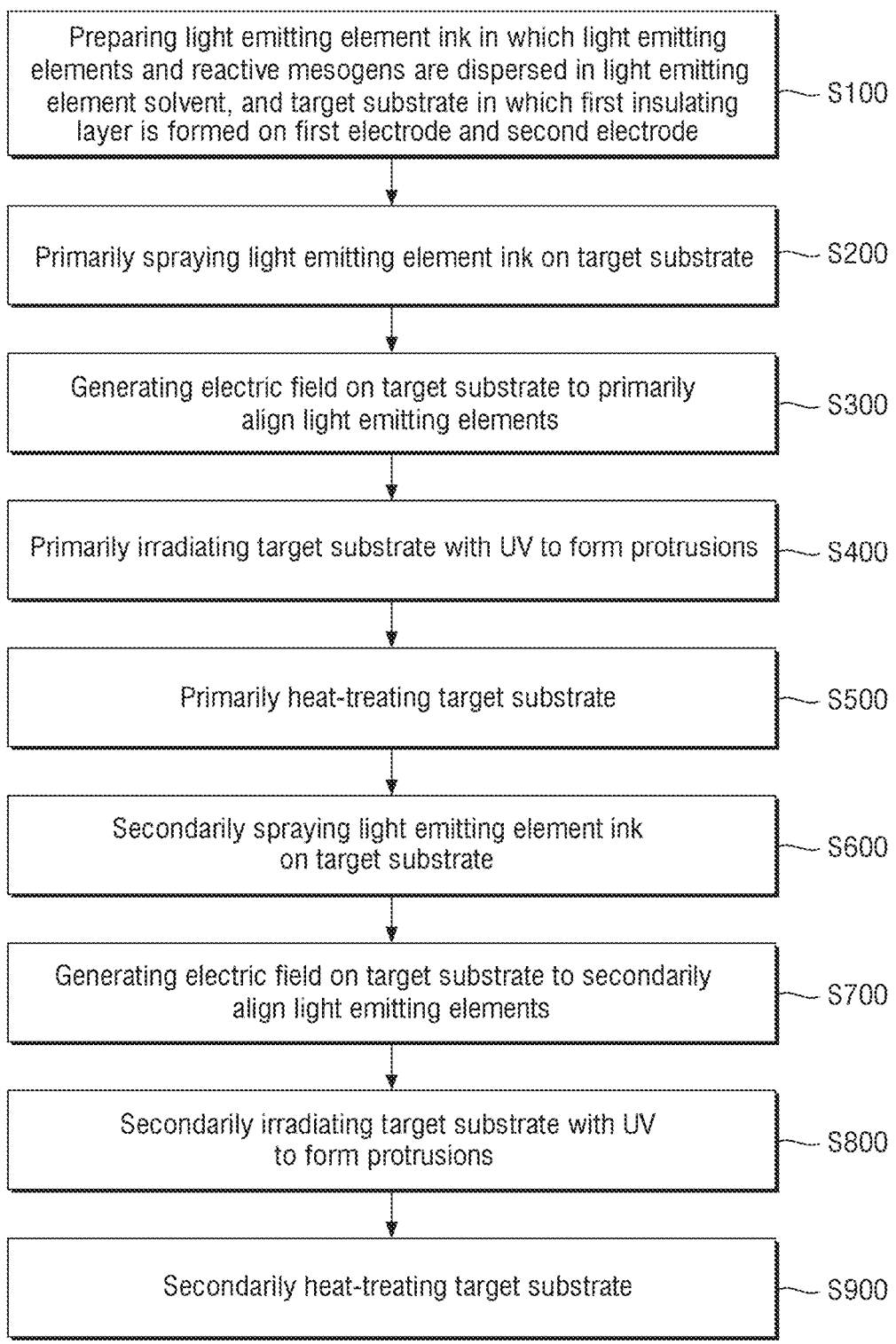
FIG. 12 is a flowchart illustrating a method of manufacturing a display device according to an embodiment.

FIG. 12 is a flowchart illustrating a method of manufacturing a display device according to an embodiment.

Referring to FIG. 12, a method of manufacturing a display device 10 according to an embodiment may include the features of: (S100) preparing a light emitting element ink 200 in which light emitting elements 30 and reactive mesogens 250 are dispersed in a solvent, and a target substrate SUB in which a first insulating layer PAS1 is formed on the first electrode 21 and the second electrode 22; (S200) primarily spraying the light emitting element ink 200 on the target substrate SUB; (S300) generating an electric field on the target substrate SUB to primarily align the light emitting elements 30 on the first electrode 21 and the second electrode 22; (S400) primarily irradiating the target substrate SUB with UV to form a plurality of protrusions 52; (S500) primarily heat-treating the target substrate SUB; (S600) secondarily spraying the light emitting element ink 200 on the target substrate SUB; (S700) generating an electric field on the target substrate SUB to secondarily align the light emitting elements 30; (S800) secondarily irradiating the target substrate SUB with UV to form a plurality of protrusions 52; and (S900) secondarily heat-treating the target substrate SUB.

Hereinafter, the method of manufacturing a display device 10 according to an embodiment will be described in more detail with reference to additional drawings together with FIG. 12.

FIGS. 13 to 25 are cross-sectional views illustrating processes in the method of manufacturing a display device according to an embodiment.

Figure 13:
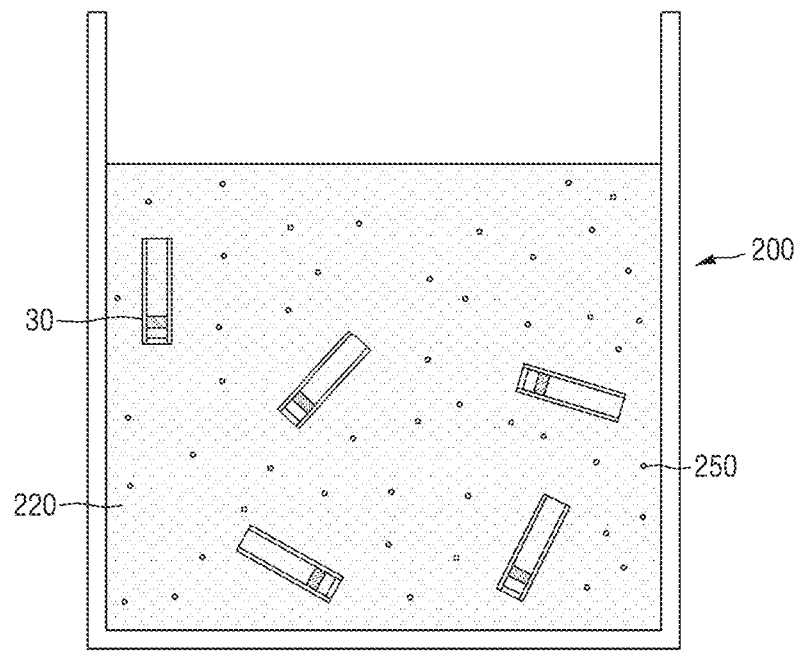
FIGS. 13 to 25 are cross-sectional views illustrating processes in the method of manufacturing a display device according to an embodiment.
Figure 14:
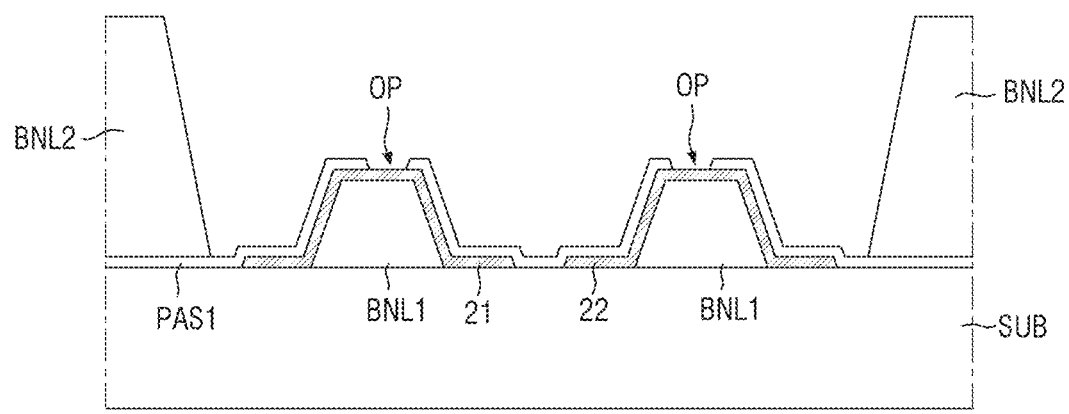

First, referring to FIGS. 13 and 14, a light emitting element ink 200 including light emitting elements 30, a solvent 220, and reactive mesogens 250, and a target substrate SUB on which a first electrode 21, a second electrode 22, a first insulating layer PAS1, and first banks BNL1 are arranged are prepared. The first insulating layer PAS1 is provided with an opening exposing each of the electrodes 21 and 22. Although it is shown in the drawings that a pair of electrodes are on the target substrate SUB, a larger number of pairs of electrodes may be on the target substrate SUB. In one or more embodiments, the target substrate SUB may include a plurality of circuit elements included thereon in addition to the above-described substrate 11 of the display device 10. Hereinafter, these circuit elements will be omitted for convenience of explanation.

The light emitting element ink 200 may include a solvent 220, and light emitting elements 30 and reactive mesogens 250 dispersed in the solvent 220. The light emitting elements 30 and the reactive mesogens 250 may be uniformly (e.g., substantially uniformly) dispersed in the solvent 220.

The step of preparing the light emitting element ink 200 may be performed through a process of mixing the light emitting elements 30, the solvent 220, and the reactive mesogens 250. As another example, a dispersant may be further mixed. For example, the step of preparing the light emitting element ink 200 may also be performed through a first dispersion process of mixing the light emitting elements 30, the solvent 220, and the reactive mesogens 250 and a second dispersion process of adding a dispersant in the solution prepared through the first dispersing process.

The dispersion process is performed by mixing the light emitting elements 30 and the reactive mesogens 250 in the solvent 220 for 5 minutes or more. As described above, each of the light emitting elements 30 may have a diameter of 1 μm or less or about 500 nm, and may have a length of 1 μm to 10 μm or about 4 μm. The light emitting elements 30 may be included in an amount of 0.01 parts by weight to 1 part by weight based on 100 parts by weight of the light emitting element ink 200, and the reactive mesogens 250 may be included in an amount of 0.1 parts by weight to 1 part by weight based on 100 parts by weight of the light emitting element ink 200. The mixing process may be performed by a sonication process, a stirring process, a milling process, and/or the like.

The light emitting element ink 200 prepared through the dispersion process may be stored at room temperature (23° C.). The reactive mesogens 250 and light emitting elements 30 may be uniformly (e.g., substantially uniformly) dispersed in the solvent 220 of the light emitting element ink 200. The light emitting elements 30 are hardly precipitated, and may be maintained in a dispersed state.

Figure 15:
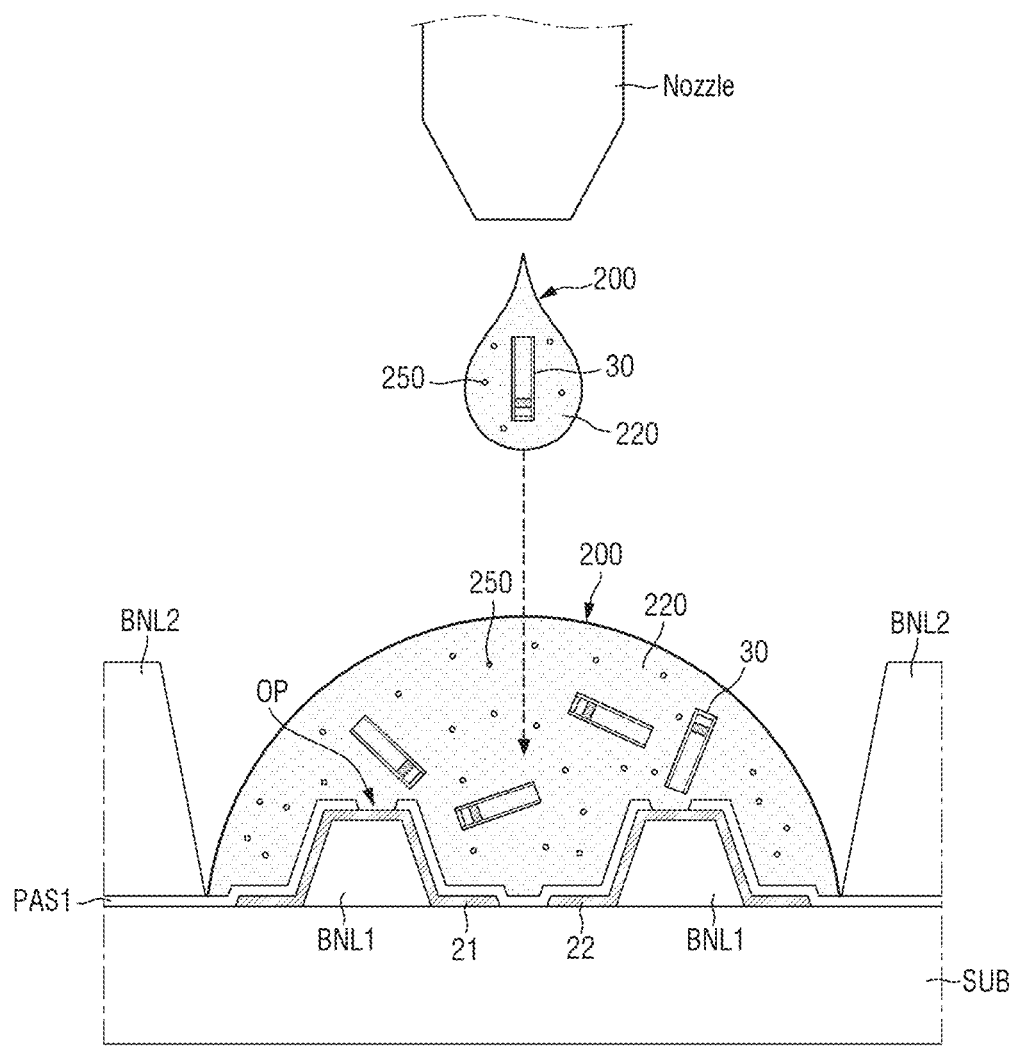

Subsequently, referring to FIG. 15, the light emitting element ink 200 is sprayed onto the first insulating layer PAS1 covering the first electrode 21 and the second electrode 22 on the target substrate SUB. In an embodiment, the light emitting element ink 200 may be sprayed on the first insulating layer PAS1 through a printing process using an inkjet printing apparatus. The light emitting element ink 200 may be sprayed through a nozzle of an inkjet head included in the inkjet printing apparatus. The light emitting element ink 200 may flow along an internal flow path provided in the inkjet head and may then be discharged onto the target substrate SUB through the nozzle. The light emitting element ink 200 discharged from the nozzle may be applied on the first insulating layer PAS1 on which the electrodes 21 and 22 on the target substrate SUB are formed. The light emitting element 30 may have a shape extending in one direction, and light emitting elements 30 may be dispersed in the light emitting element ink 200 in a state where the extending direction of the light emitting element has a random alignment direction.

When the light emitting element ink 200 is sprayed on the first insulating layer PAS1, the light emitting element ink 200 may uniformly (e.g., substantially uniformly) spread between the second banks BNL2 without (or substantially without) overflowing over the second banks BNL2. Thus, the light emitting elements 30 and reactive mesogens 250 dispersed in the light emitting element ink 200 may also be uniformly (e.g., substantially uniformly) dispersed between the second banks BNL2.

Subsequently, the step (S300) of generating an electric field on the target substrate SUB to align the light emitting elements on the electrodes 21 and 22 may be performed.

Figure 16:
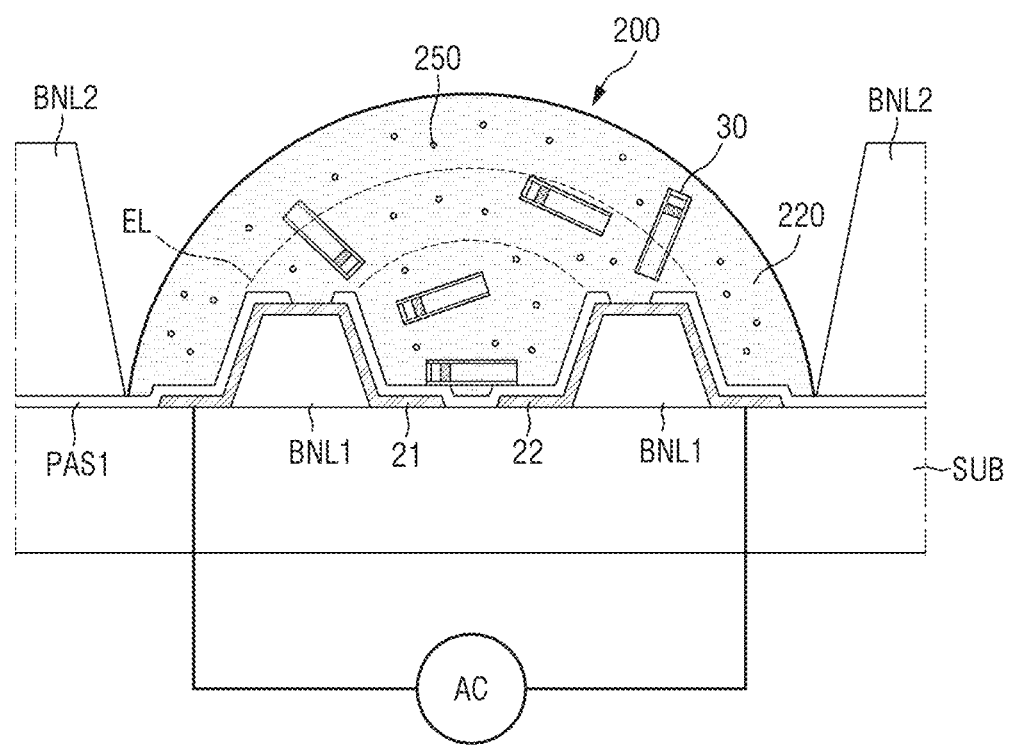

Referring to FIG. 16, when the light emitting element ink 200 including the light emitting elements 30 and the reactive mesogens 250 is sprayed onto the target substrate SUB, an alignment signal is applied to the electrodes 21 and 22 to generate an electric field EL on the target substrate SUB. The light emitting elements 30 dispersed in the solvent 220 may receive a dielectrophoretic force by the electric field EL, and may be arranged on the electrodes 21 and 22 while changing the alignment direction and position thereof.

When the electric field EL is generated on the target substrate SUB, the light emitting elements 30 may receive a dielectrophoretic force. When the electric field EL generated on the target substrate SUB is generated in parallel (e.g., substantially in parallel) to the upper surface of the target substrate SUB, the light emitting elements 30 may be arranged such that the extending direction thereof is parallel (e.g., substantially parallel) to the target substrate SUB and may be arranged on the first electrode 21 and the second electrode 22. Each of the light emitting elements 30 may move toward the electrodes 21 and 22 from the initially dispersed position by the dielectrophoretic force. Both ends of the light emitting element 30 may be on the first electrode 21 and the second electrode 22, respectively, while the position and alignment direction thereof are changed by the electric field EL. The light emitting element 30 may include semiconductor layers doped with different conductivity types (e.g., doped with different kinds of electrically conductive dopants), and may have a dipole moment therein.

When the light emitting element 30 having a dipole moment is placed on the electric field EL, the light emitting element 30 may be subjected to the dielectrophoretic force such that both ends thereof are on the electrodes 21 and 22, respectively.

After the light emitting element 30 is between the electrodes 21 and 22, the step (S400) of primarily irradiating the target substrate SUB with UV to form a plurality of protrusions 52 may be performed.

Figure 17:
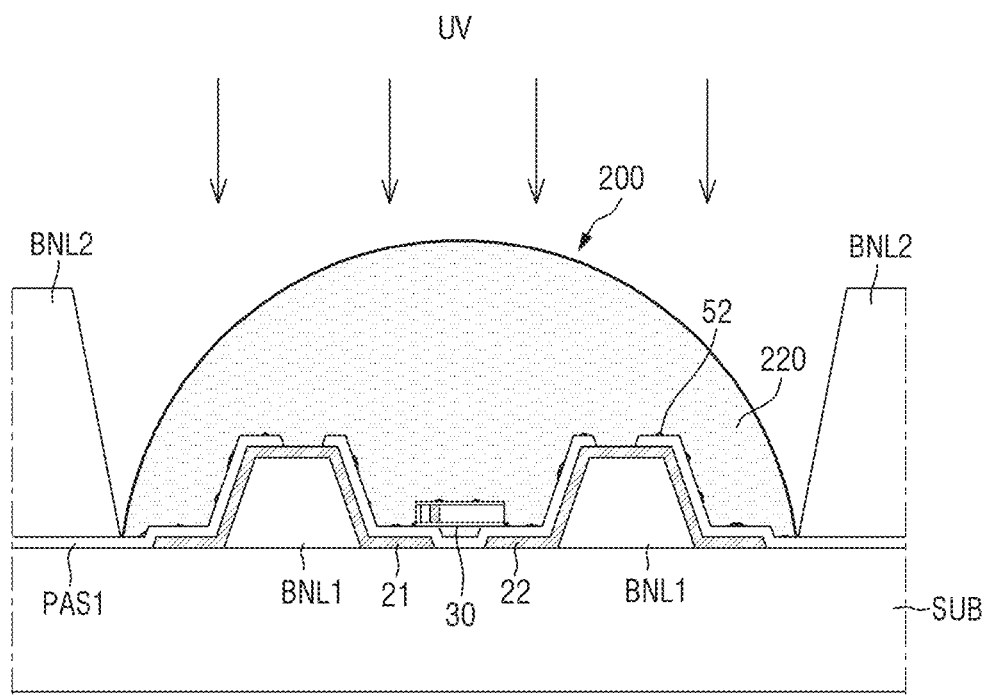

Referring to FIG. 17, when the target substrate SUB is primarily irradiated with UV, the reactive mesogens 250 dispersed in the light emitting element ink 200 may be polymerized to form a polymer, and may thus be attached and fixed to the target substrate SUB. This polymer may be on the first insulating layer PAS1 and the light emitting element 30 to be formed into a plurality of protrusions 52.

The plurality of protrusions 52 may be spaced apart from each other and may be randomly arranged on the first insulating layer PAS1 and the light emitting element 30. The plurality of protrusions 52 may attach and fix the light emitting elements 30 to the first insulating layer PAS1 to prevent the aligned light emitting elements 30 from being detached in a subsequent process (or to reduce a likelihood or occurrence of such detachment).

Subsequently, the step (S500) of primarily heat-treating the target substrate SUB to remove the solvent 220 may be performed.

Figure 18:
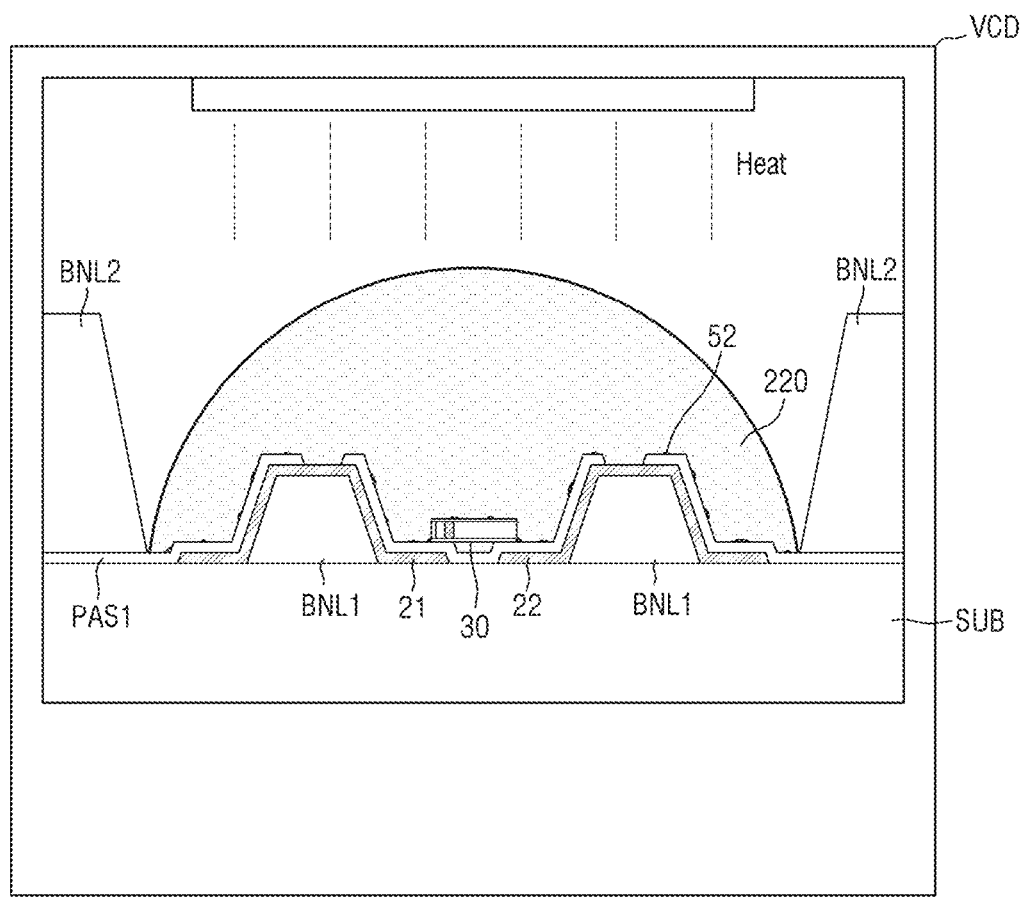
Figure 19:
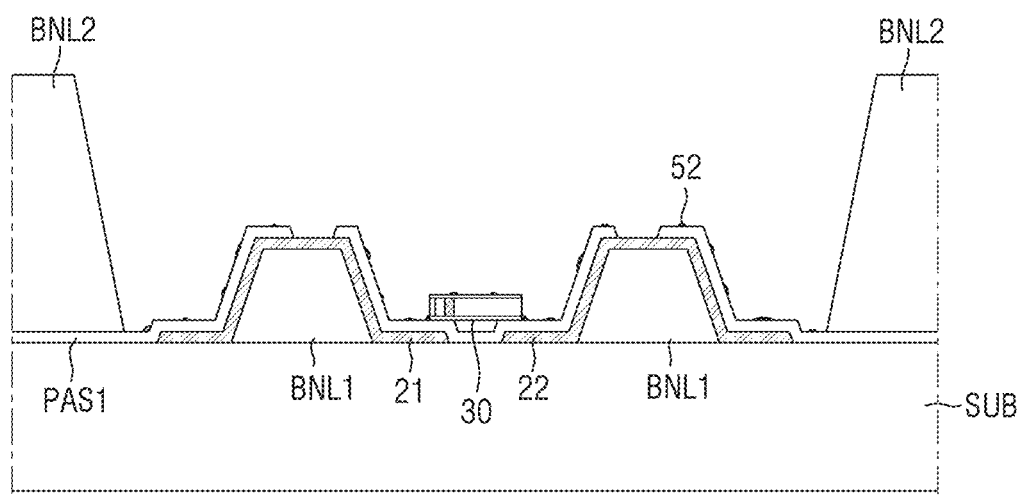

Referring to FIGS. 18 and 19, the primary heat treatment process may be performed in a chamber VCD capable of adjusting internal pressure. In the chamber VCD, the internal pressure in the device may be adjusted, and the target substrate SUB may be heated in a state in which the internal pressure is adjusted, so as to remove the solvent 220.

In the method of manufacturing the display device 10, the solvent 220 may be heat-treated under an environment of low-pressure to be completely (or substantially completely) removed. According to an embodiment, the process of removing the solvent 220 may be performed at a pressure of $10^{-4}$ Torr to 1 Torr and a temperature of 25° C. to 150° C. When the heat treatment process is performed within the above pressure range, the boiling point of the solvent 220 may be lowered, and thus the solvent 220 may be more easily removed. The heat treatment process performed in the chamber VCD may be performed for 1 minute to 30 minutes. However, the present disclosure is not limited thereto.

As the solvent 220 is removed, the light emitting elements 30 aligned on the first insulating layer PAS1, and the plurality of protrusions 52 on the first insulating layer PAS1 and the light emitting element 30 remain.

Subsequently, referring to FIG. 20, the step (S600) of secondarily spraying the light emitting element ink 200 onto the target substrate SUB. In the secondary spraying process, light emission efficiency may be increased by increasing the number of light emitting elements 30. Because processes after the second spraying process are the same as the above processes up to the first heat treatment process after the first spraying process, duplicative descriptions thereof will not be repeated here.

Figure 20:
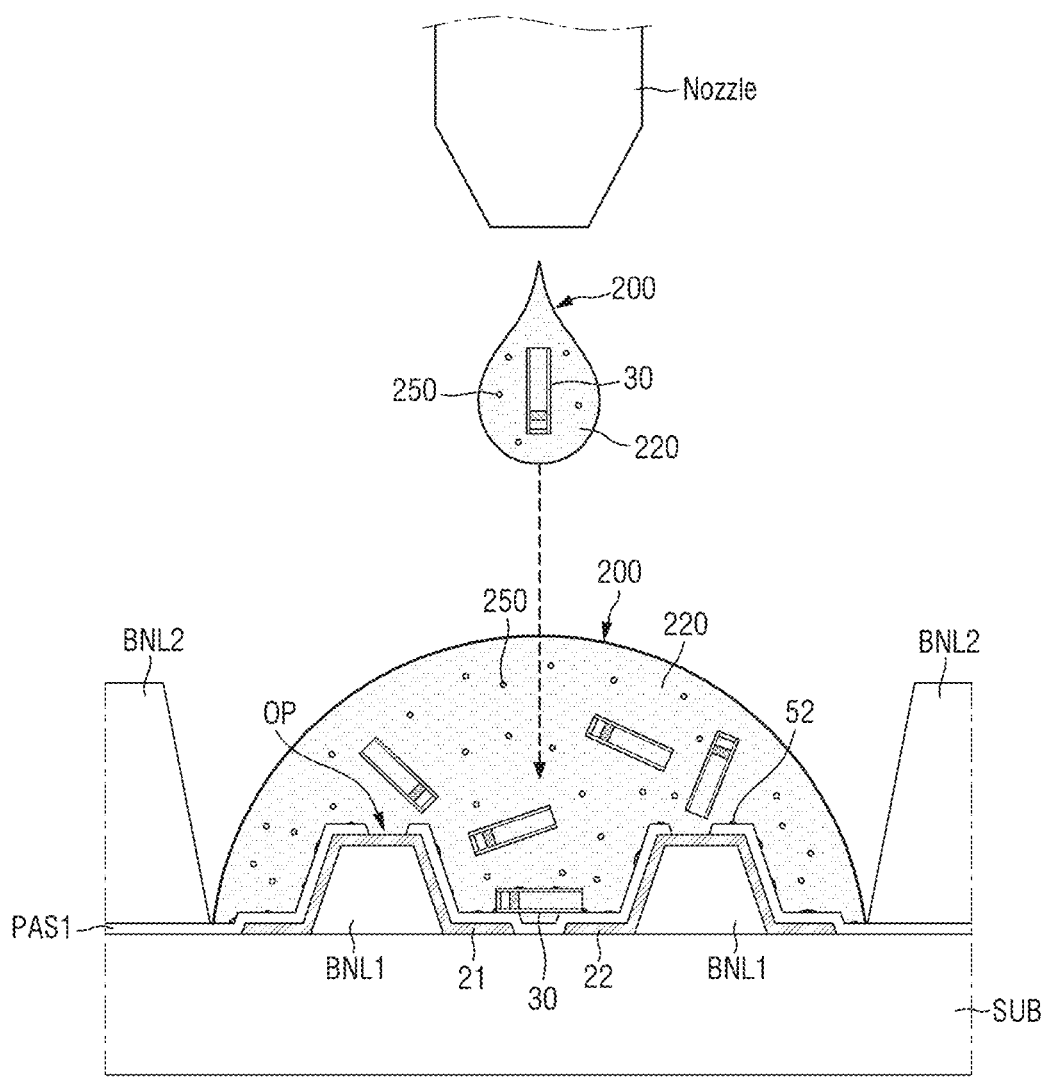

Referring to FIG. 20, the light emitting element ink 200 is secondarily sprayed onto the first insulating layer PAS1, the light emitting element 30, and the plurality of protrusions 52, which are arranged on the target substrate SUB. The light emitting element ink 200 may include a solvent 220, and light emitting elements 30 and reactive mesogens 250 dispersed in the solvent 220 in the same (e.g., substantially the same) manner as in the first spraying process. The light emitting element ink 200 may be sprayed onto the target substrate SUB through a printing process using an inkjet printing apparatus. Like the primary spraying process, the light emitting element ink 200 may uniformly (e.g., substantially uniformly) spread between the second banks BNL2 without (or substantially without) overflowing over the second banks BNL2. Thus, the light emitting elements 30 and reactive mesogens 250 dispersed in the light emitting element ink 200 may also be uniformly (e.g., substantially uniformly) dispersed between the second banks BNL2.

Subsequently, the step (S700) of secondarily aligning the light emitting elements 30 on the electrodes 21 and 22 by generating an electric field on the target substrate SUB may be performed.

Figure 21:
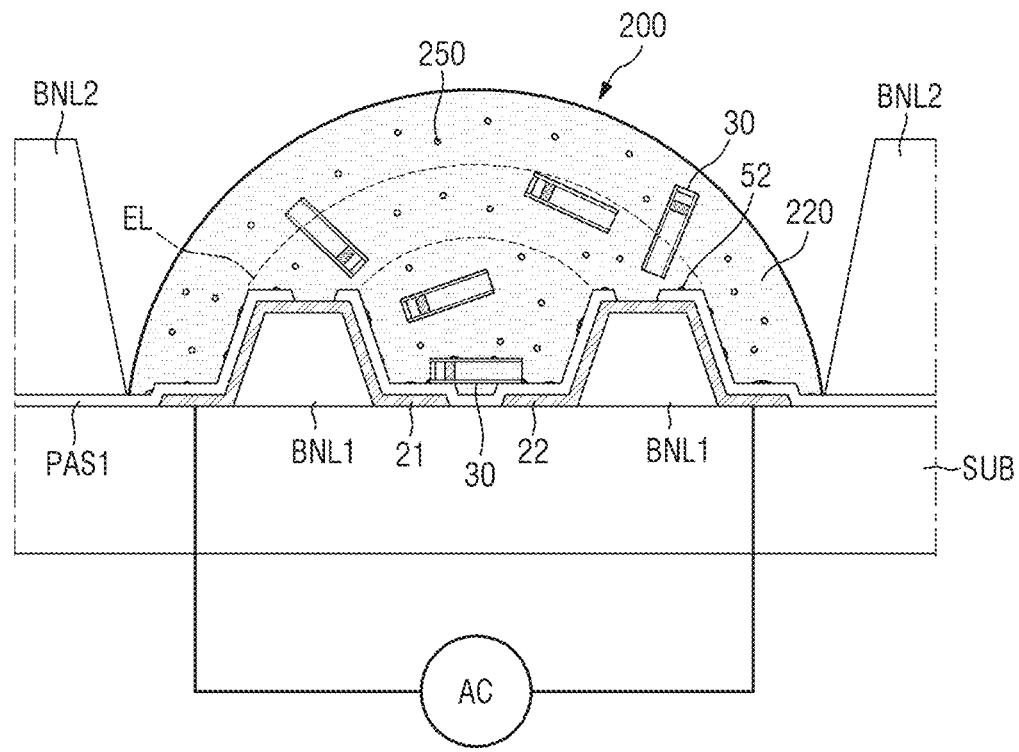

Referring to FIG. 21, when the light emitting element ink 200 including the light emitting elements 30 and the reactive mesogens 250 is sprayed onto the target substrate SUB, an alignment signal is applied to the electrodes 21 and 22 to generate an electric field EL on the target substrate SUB. The light emitting elements 30 dispersed in the solvent 220 may receive a dielectrophoretic force by the electric field EL, and may be arranged on the electrodes 21 and 22 while changing the alignment direction and position thereof. In the secondary alignment process, the light emitting elements may be arranged between the first electrode 21 and the second electrode on which the light emitting elements 30 aligned in the primary alignment process are not arranged.

After the light emitting element 30 is between the electrodes 21 and 22, the step (S800) of secondarily irradiating the target substrate SUB with UV to form a plurality of protrusions 52 may be performed.

Figure 22:
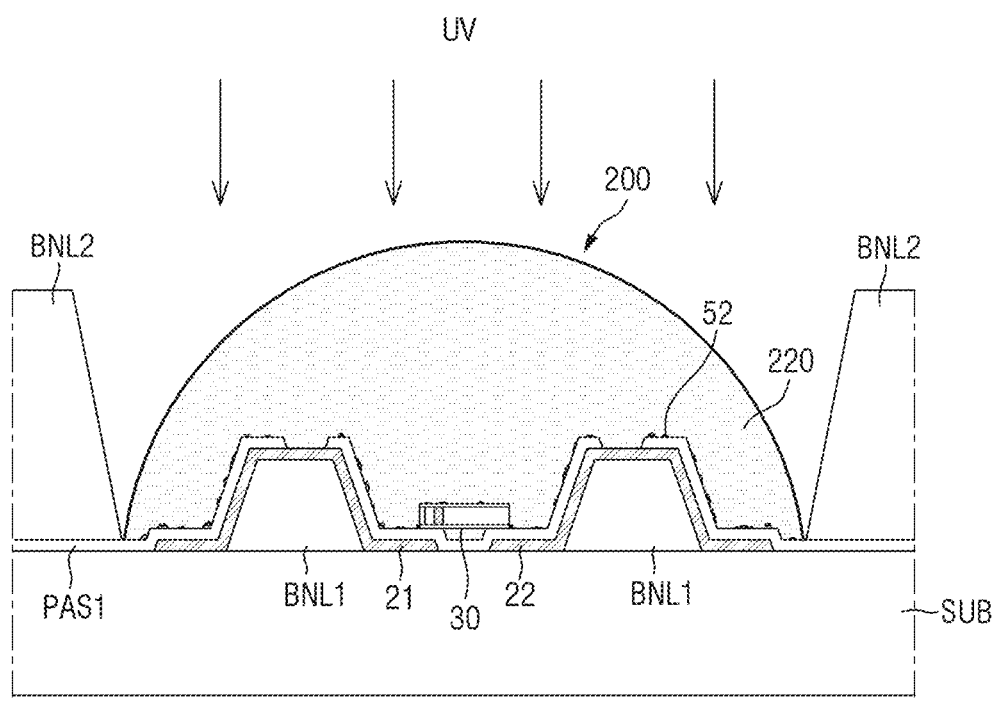

Referring to FIG. 22, when the target substrate SUB is secondarily irradiated with UV, the reactive mesogens 250 dispersed in the light emitting element ink 200 may be polymerized to form a polymer, and may thus be attached and fixed to the target substrate SUB. This polymer may be on the first insulating layer PAS1 and the light emitting element 30 to be formed into a plurality of protrusions 52. In this case, these plurality of protrusions 52 may overlap the plurality of protrusions 52 previously formed, or may be formed at positions where the plurality of protrusions 52 are not included.

The plurality of protrusions 52 may be formed in a larger number due to the primary and secondary UV irradiation processes, and may attach and fix the light emitting elements 30 to the first insulating layer PAS1 to prevent the aligned light emitting elements 30 from being detached in a subsequent process (or to reduce a likelihood or occurrence of such detachment).

Subsequently, the step (S900) of secondarily heat-treating the target substrate SUB to remove the solvent 220 may be performed.

Figure 23:
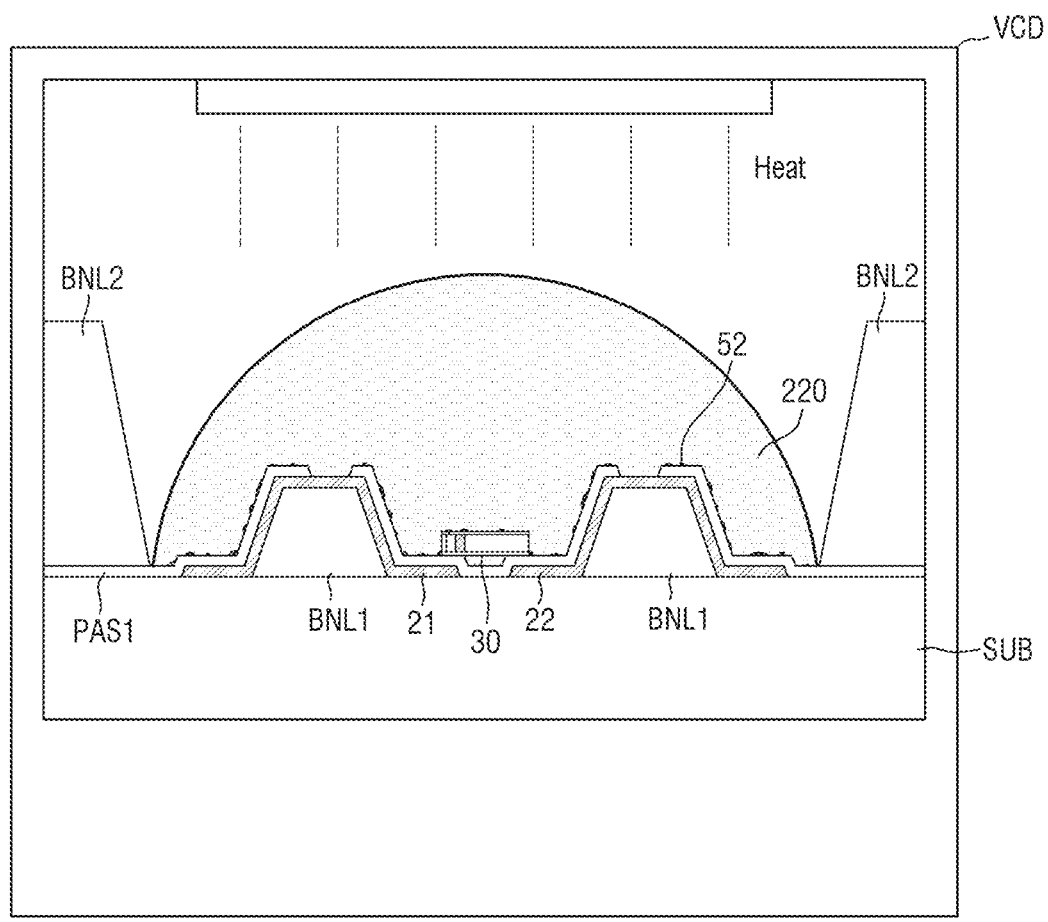
Figure 24:
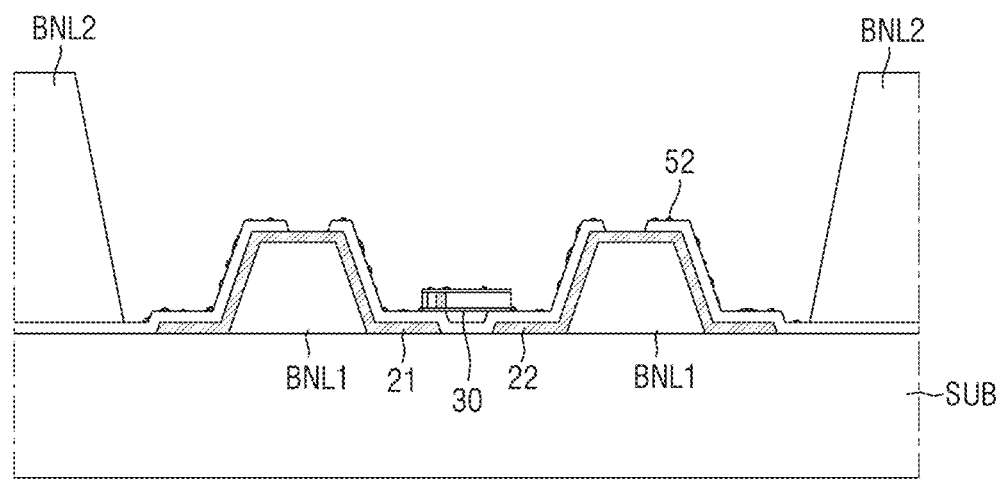

Referring to FIGS. 23 and 24, like the primary heat treatment process, in the secondary heat treatment process, the target substrate SUB may be heated in the chamber VCD to remove the solvent 220.

As the solvent 220 is removed, the light emitting elements 30 aligned on the first insulating layer PAS1, and the plurality of protrusions 52 on the first insulating layer PAS1 and the light emitting element 30 remain. Then, a process of cleaning the target substrate SUB may be performed, and unreacted reactive mesogens 250 not polymerized by UV may be removed by the cleaning process.

Next, a step of forming a first contact electrode CNE1, a second insulating layer PAS2, a second contact electrode CNE2, and a third insulating layer PAS3 on the target substrate SUB is performed.

Figure 25:
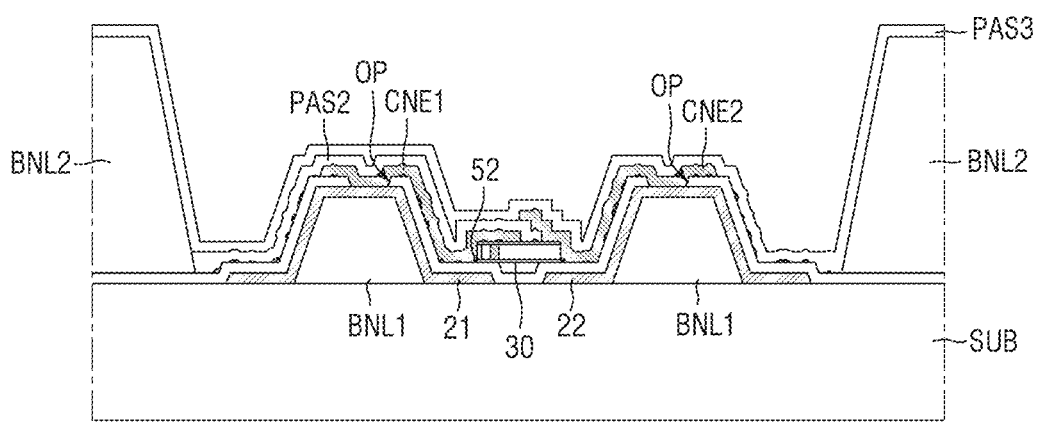

Referring to FIG. 25, an electrode material layer is stacked on the target substrate SUB provided thereon with the first insulating layer PAS1, the light emitting element 30, and the plurality of protrusions and patterned to form a first contact electrode CNE1. The first contact electrode CNE1 is in contact (e.g., physical contact) with one end of the light emitting element 30 while contacting (e.g., physically contacting) the first electrode 21 through the opening OP. Further, an insulating material is applied onto the target substrate SUB and patterned to form a second insulating layer PAS2 covering the first contact electrode CNE1 and exposing the other end of the light emitting element 30. Further, an electrode material layer is stacked on the target substrate SUB and patterned to form a second contact electrode CNE2. The second contact electrode CNE2 is in contact (e.g., physical contact) with the other end of the light emitting element 30 while contacting (e.g., physically contacting) the second electrode 22 through the opening OP. Then, a third insulating layer PAS3 is formed on the target substrate SUB to manufacture a display device according to an embodiment.

As described above, according to a light emitting element ink, a display device, and a method of manufacturing the display device according to embodiments, a plurality of protrusions contacting (e.g., physically contacting) a light emitting element and a first insulating layer are provided, and thus the light emitting element may be attached and fixed to the first insulating layer. Accordingly, it is possible to prevent the detachment of the light emitting element (or to reduce a likelihood or occurrence of such detachment), which may be caused by movement of a substrate and/or an external force after a process of aligning the light emitting elements.

In concluding the detailed description, those skilled in the art will appreciate that many variations and modifications can be made to the disclosed embodiments without substantially departing from the principles of the present disclosure. Therefore, the disclosed example embodiments of the present disclosure are used in a generic and descriptive sense only and not for purposes of limitation.

What is claimed is:

1. A display device, comprising:
    a substrate;
    a first electrode and a second electrode each extending on the substrate in one direction and spaced apart from each other;
    a first insulating layer on the substrate and covering the first electrode and the second electrode;
    a light emitting element on the first insulating layer and having two ends on the first electrode and the second electrode, respectively; and
    a plurality of protrusions arranged on the first insulating layer and the light emitting element.

2. The display device of claim 1, wherein the plurality of protrusions include a polymer produced by polymerization of the reactive mesogen.

3. The display device of claim 1, wherein the plurality of protrusions are randomly arranged to be spaced apart from each other and expose at least a portion of the surface of the first insulating layer.

4. The display device of claim 1, wherein at least one of the plurality of protrusions overlaps the light emitting element and the first insulating layer.

5. The display device of claim 1, wherein at least one of the plurality of protrusions is in contact with the first insulating layer and the light emitting element.

6. The display device of claim 1, wherein the light emitting element includes a first semiconductor layer, a light emitting layer, a second semiconductor layer, and an electrode layer, which are stacked in one direction, and the light emitting element further includes an insulating film partially surrounding outer surfaces of the first semiconductor layer, the light emitting layer, the second semiconductor layer, and the electrode layer.

7. The display device of claim 6, further comprising:
    a first contact electrode on the first electrode and contacting one end of the light emitting element; and
    a second contact electrode on the second electrode and contacting the other end of the light emitting element.

8. The display device of claim 7, wherein at least one of the plurality of protrusions is between the first contact electrode and the light emitting element, and is in contact with the first contact electrode, the light emitting element, and the first insulating layer.

9. The display device of claim 8, wherein at least one of the plurality of protrusions is in contact with the first contact electrode, the first insulating layer, and the electrode layer at one end of the light emitting element.

10. The display device of claim 7, wherein at least one of the plurality of protrusions is between the second contact electrode and the light emitting element, and is in contact with the second contact electrode, the light emitting element, and the first insulating layer.

11. The display device of claim 10, wherein at least one of the plurality of protrusions is in contact with the second contact electrode, the first insulating layer, and the first semiconductor layer at the other end of the light emitting element.

12. The display device of claim 1, further comprising:
    a bank that partitions a light emission area in which the light emitting element is on the first insulating layer, and the plurality of protrusions are arranged in the light emission area.

* * * * *